(12) United States Patent
Ooishi

(10) Patent No.: US 7,170,776 B2
(45) Date of Patent: Jan. 30, 2007

(54) NON-VOLATILE MEMORY DEVICE CONDUCTING COMPARISON OPERATION

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/391,227

(22) Filed: Mar. 29, 2006

(65) Prior Publication Data

US 2006/0187736 A1 Aug. 24, 2006

Related U.S. Application Data

(60) Continuation of application No. 11/124,138, filed on May 9, 2005, now abandoned, which is a division of application No. 10/354,070, filed on Jan. 30, 2003, now abandoned.

(30) Foreign Application Priority Data

Aug. 22, 2002 (JP) .............................. 2002-242396

(51) Int. Cl.
  G11C 11/00 (2006.01)
  G11C 7/06 (2006.01)
  G11C 7/02 (2006.01)
  G06F 12/00 (2006.01)
  G11C 11/14 (2006.01)

(52) U.S. Cl. ...................... 365/158; 365/171; 365/173; 365/189.07; 365/206; 711/169

(58) Field of Classification Search ................ 365/158, 365/171, 206; 711/169
See application file for complete search history.

(56) References Cited

U.S. PATENT DOCUMENTS

| 6,052,302 | A | | 4/2000 | Moyer et al. |
|---|---|---|---|---|
| 6,088,277 | A | * | 7/2000 | Kim et al. .................. 365/207 |
| 6,191,973 | B1 | | 2/2001 | Moyer |
| 6,272,046 | B1 | * | 8/2001 | Shimada ................ 365/185.17 |
| 6,314,044 | B1 | * | 11/2001 | Sasaki et al. .......... 365/230.03 |
| 6,359,829 | B1 | | 3/2002 | Van Den Berg |
| 6,778,445 | B2 | | 8/2004 | Ooishi et al. |
| 2003/0090933 | A1 | | 5/2003 | Hidaka |
| 2005/0024932 | A1 | | 2/2005 | Ohshima et al. |

FOREIGN PATENT DOCUMENTS

TW 498335 8/1991

OTHER PUBLICATIONS

Scheuerlein et al., "A 10ns Read and Write Non-Volatile Memory Array Using a Magnetic Tunnel Junction and FET Switch in Each Cell", ISSCC Digest of Technical Papers, TA7.2, Feb. 2000, pp. 94-95, 128-129, 409-410.

Durlam et al., "Nonvolatile RAM based on Magnetic Tunnel Junction Elements", ISSCC Digest of Technical Papers, TA7.3, Feb. 2000, pp. 96-97, 130-131, 410-411.

(Continued)

Primary Examiner—Amir Zarabian
Assistant Examiner—Ly Duy Pham
(74) Attorney, Agent, or Firm—Buchanan Ingersoll & Rooney PC

(57) ABSTRACT

The non-volatile memory device includes a current detection circuit for comparing, in data retrieve operation, storage information written in a non-volatile manner in a memory cell row with retrieval information in order to determine whether or not the storage information matches the retrieval information. The current detection circuit compares a data read current flowing through each bit line corresponding to each memory cell of a memory cell row storing the storage information with a data read current flowing through each bit line corresponding to each retrieval memory cell storing the retrieval information.

1 Claim, 21 Drawing Sheets

OTHER PUBLICATIONS

Naji et al., "A 256kb 3.0V 1T1MTJ Nonvolatile Magnetoresistive RAM", ISSCC Digest of Technical Papers, TA7.6, Feb. 2001, pp. 94-95, 122-123, 404-405, 438.

"Forefront of Non-Volatile Memory/The Future in Intel's Mind: From Flash Memory to OUM", Nikkei Microdevices, Mar. 2002, pp. 65-78.

* cited by examiner

NON-VOLATILE MEMORY DEVICE CONDUCTING COMPARISON OPERATION

CROSS-REFERENCE TO RELATED APPLICATIONS

This application is a Continuation of U.S. application Ser. No. 11/124,138, filed on May 9, 2005 now abandoned, which is a Divisional Application of U.S. application Ser. No. 10/354,070 filed on Jan. 30, 2003, now abandoned.

BACKGROUND OF THE INVENTION

1. Field of the Invention

The present invention generally relates to a non-volatile memory device. More particularly, the present invention relates to a non-volatile memory device having a data retrieval function to compare applied retrieval data with storage data in order to determine whether or not the retrieval data matches the storage data.

2. Description of the Background Art

An MRAM (Magnetic Random Access Memory) device has attracted attention as a new-generation non-volatile memory device. The MRAM device is a non-volatile memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 21 schematically shows the structure of a memory cell having a magnetic tunnel junction (hereinafter, sometimes simply referred to as "MTJ memory cell").

Referring to FIG. 21, the MTJ memory cell includes a tunneling magneto-resistance element TMR and an access transistor ATR. Tunneling magneto-resistance element TMR has an electric resistance varying according to a magnetically written storage data level. Access transistor ATR is connected in series with tunneling magneto-resistance element TMR between a bit line BL and a source line SL. Typically, a field effect transistor formed on a semiconductor substrate is used as access transistor ATR.

A bit line BL, a write digit line WDL, a word line WL and a source line SL are provided for the MTJ memory cell. Bit line BL and write digit line WDL allow data write currents of different directions to flow therethrough in data write operation, respectively. Word line WL is used to conduct data read operation. Source line SL pulls down tunneling magneto-resistance element TMR to a ground voltage GND in data read operation. In data read operation, tunneling magneto-resistance element TMR is electrically coupled between source line SL and bit line BL in response to turning-ON of access transistor ATR.

FIG. 22 is a conceptual diagram illustrating data write operation to the MTJ memory cell.

Referring to FIG. 22, tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction corresponding to an external magnetic field (hereinafter, sometimes simply referred to as "free magnetic layer"). A tunneling barrier (tunneling film) TB is formed between fixed magnetic layer FL and free magnetic layer VL. Tunneling barrier TB is formed from an insulator film. Free magnetic layer VL is magnetized either in the same direction as or in the opposite direction to that of fixed magnetic layer FL according to a write data level. Fixed magnetic layer FL, tunneling barrier TB and free magnetic layer VL form a magnetic tunnel junction.

The electric resistance of tunneling magneto-resistance element TMR varies according to the relation between the respective magnetization directions of fixed magnetic layer FL and free magnetic layer VL. More specifically, the electric resistance of tunneling magneto-resistance element TMR has a minimum value Rmin when fixed magnetic layer FL and free magnetic layer VL have the same (parallel) magnetization direction, and has a maximum value Rmax when they have opposite (antiparallel) magnetization directions.

In data write operation, word line WL is inactivated and access transistor ATR is turned OFF. In this state, a data write current for magnetizing free magnetic layer VL is applied to each of bit line BL and write digit line WDL in a direction corresponding to the write data level.

FIG. 23 is a conceptual diagram showing the relation between the data write current and the magnetization direction of the tunneling magneto-resistance element in data write operation.

Referring to FIG. 23, the abscissa H(EA) indicates a magnetic field which is applied to free magnetic layer VL of tunneling magneto-resistance element TMR in the easy-axis (EA) direction. The ordinate H(HA) indicates a magnetic field which is applied to free magnetic layer VL in the hard-axis (HA) direction. Magnetic fields H(EA), H(HA) respectively correspond to two magnetic fields produced by the currents flowing through bit line BL and write digit line WDL.

In the MTJ memory cell, fixed magnetic layer FL is magnetized in the fixed direction along the easy axis of free magnetic layer VL. Free magnetic layer VL is magnetized either in the direction parallel or antiparallel (opposite) to that of fixed magnetic layer FL along the easy axis according to the storage data level ("1" and "0"). The MTJ memory cell is thus capable of storing one-bit data ("1" and "0") according to the two magnetization directions of free magnetic layer VL.

The magnetization direction of free magnetic layer VL can be rewritten only when the sum of the applied magnetic fields H(EA) and H(HA) reaches the region outside the asteroid characteristic line in FIG. 23. In other words, the magnetization direction of free magnetic layer VL does not change if the strength of an applied data write magnetic field corresponds to the region inside the asteroid characteristic line.

As shown by the asteroid characteristic line, applying a magnetic field of the hard-axis direction to free magnetic layer VL enables reduction in a magnetization threshold value required to change the magnetization direction along the easy axis. When the operation point of data write operation is designed as in the example of FIG. 23, a data write magnetic field of the easy-axis direction is designed to have a strength $H_{WR}$ in the MTJ memory cell to be written. In other words, a data write current to be applied to bit line BL or write digit line WDL is designed to produce the data write magnetic field $H_{WR}$. In general, data write magnetic field $H_{WR}$ is given by the sum of a switching magnetic field $H_{SW}$ required to switch the magnetization direction and a margin $\Delta H$. Data write magnetic field $H_{WR}$ is thus given by $H_{WR}=H_{SW}+\Delta H$.

In order to rewrite the storage data of the MTJ memory cell; that is, the magnetization direction of tunneling magneto-resistance element TMR, a data write current of a predetermined level or more must be applied to both write digit line WDL and bit line BL. Free magnetic layer VL in tunneling magneto-resistance element TMR is thus magnetized in the direction parallel or opposite (antiparallel) to that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another data write operation is conducted.

FIG. 24 is a conceptual diagram illustrating data read operation from the MTJ memory cell.

Referring to FIG. 24, in data read operation, access transistor ATR is turned ON in response to activation of word line WL. As a result, tunneling magneto-resistance element TMR is pulled down to ground voltage GND and electrically coupled to bit line BL.

If bit line BL is then pulled up to a predetermined voltage, a memory cell current Icell corresponding to the electric resistance of tunneling magneto-resistance element TMR, that is, the storage data level of the MTJ memory cell, flows through a current path including bit line BL and tunneling magneto-resistance element TMR. For example, the storage data can be read from the MTJ memory cell by comparing memory cell current Icell with a predetermined reference current.

A data read current flows through tunneling magneto-resistance element TMR in data read operation. However, data read current Is is commonly set to a value that is about one to two orders smaller than the above data write current. Therefore, it is less likely that the storage data in the MTJ memory cell is erroneously rewritten due to the data read current Is in data read operation. In other words, non-destructive data read operation is possible.

FIG. 25 shows the structure of an MTJ memory cell formed on a semiconductor substrate.

Referring to FIG. 25, an access transistor ATR formed on a semiconductor main substrate SUB has impurity regions (n-type regions) 310, 320 and a gate 330. Impurity region 310 is electrically coupled to a source line SL through a metal film formed in a contact hole 341.

A write digit line WDL is formed in a metal wiring layer provided above source line SL. A tunneling magneto-resistance element TMR is provided above write digit line WDL. Tunneling magneto-resistance element TMR is electrically coupled to impurity region 320 of access transistor ATR through a strap 350 and a metal film formed in a contact hole 340. Strap 350 is formed from a conductive material, and is provided in order to electrically couple tunneling magneto-resistance element TMR to access transistor ATR. A bit line BL is provided above tunneling magneto-resistance element TMR and is electrically coupled to tunneling magneto-resistance element TMR.

Bit line BL receiving a data write current and a data read current and write digit line WDL receiving a data write current are formed using a metal wiring layer. Word line WL is provided in order to control the gate voltage of access transistor ATR. Therefore, it is not necessary to actively supply a current to word line WL. For improved integration, word line WL is commonly formed without using an additional independent metal wiring layer. In other words, word line WL is commonly formed in the same wiring layer as that of gate 330 by using a polysilicon layer or a polycide layer.

The MRAM device is thus capable of storing data in a non-volatile manner by using MTJ memory cells integrated on the semiconductor substrate. In each MTJ memory cell, the electric resistance of tunneling magneto-resistance element TMR varies according to the magnetization direction that is rewritable by an applied data write magnetic field. Accordingly, non-volatile data storage can be realized by using electric resistances Rmax, Rmin of tunneling magneto-resistance element TMR as the storage data levels ("1" and "0").

An OUM (Ovonic Unified memory) cell increasingly attracts attention as a different type of non-volatile memory cell. The OUM is disclosed in, e.g., "Forefront of Non-Volatile Memory/The Future in Intel's Mind: From Flash Memory to OUM," Nikkei Microdevices, March, 2002, pp. 65–78. The OUM cell is formed by a thin-film chalcogenide layer and a heat-generating element. Chalcogenide changes into an amorphous or crystalline state according to the heating pattern of the heat-generating element through which a data write current flows. The electric resistance of the chalcogenide layer varies between the amorphous state and the crystalline state. Therefore, non-volatile data storage can be implemented in the OUM cell by setting two supply patterns of the data write current (which correspond to two heating patterns for changing the chalcogenide layer into the amorphous and crystalline states, respectively) according to the write data level.

As described above, the MTJ memory cell is the same as the OUM cell in that current supply is required for data write operation and in that the electric resistance varies according to the storage data.

One of the main applications of the memory device is an associative memory which compares applied retrieval data with storage data in order to determine whether or not the retrieval data matches the storage data. At present, SRAM (Static Random Access Memory) cells based on a cross-coupled latch of the CMOS (Complementary Metal Oxide Semiconductor) structure are used in the associative memory. However, the SRAM cell has a large area. Moreover, the SRAM cell is a volatile memory in which the data stored therein is lost upon power-down. Therefore, the use of the SRAM cells is not always convenient.

It is also possible to use a commonly used non-volatile memory device, i.e., an EEPROM (Electrically Erasable/Programmable Read Only Memory) or a flash memory (R), in the associative memory. However, the EEPROM and the flash memory require a relatively long time for data write operation (program operation).

SUMMARY OF THE INVENTION

It is an object of the present invention to provide a non-volatile memory device conducting a so-called comparison operation of an associative memory at a high speed by using a novel type of non-volatile memory such as an MTJ memory cell and an OUM cell described above.

According to one aspect of the present invention, a non-volatile memory device includes a plurality of memory cells arranged in a matrix, a plurality of word lines provided corresponding to memory cell rows, and a comparison circuit. Each of the plurality of memory cells has an electric resistance varying according to storage data written in a non-volatile manner by a data write current. Of the plurality of memory cells, memory cells of a predetermined memory cell row have retrieval information, and memory cells of other memory cell rows have storage information. In data retrieve operation, the comparison circuit compares the retrieval information read from the predetermined memory cell row with the storage information read from one of the other memory cell rows which is designated for the data retrieve operation in order to determine whether or not the storage information matches the retrieval information.

The non-volatile memory device of the present invention has a comparison circuit for comparing storage information written in a non-volatile manner in a memory cell row with retrieval information in data retrieve operation in order to determine whether or not the storage information matches the retrieval information. Therefore, a main advantage of the present invention is as follows: since storage data in a memory cell having the storage information is stored in a non-volatile manner, the storage data is not lost even if supply of a power supply voltage is discontinued. This ensures stable comparison operation.

According to another aspect of the present invention, a non-volatile memory device includes a memory block, a comparison circuit, and a control circuit. The memory block has a plurality of memory cells arranged in a matrix. Each of the plurality of memory cells has an electric resistance varying according to storage data written in a non-volatile manner by a data write current. The comparison circuit conducts comparison of retrieval information received from outside in data retrieve operation. The comparison circuit includes a storage section for temporal data storage. The control circuit transfers storage information pre-stored in the memory block to the storage section in the data retrieve operation. The comparison circuit compares the storage information transferred to the storage section with the retrieval information in order to determine whether or not the storage information matches the retrieval information.

The non-volatile semiconductor device of the present invention includes a memory block having a plurality of memory cells for holding storage data in a non-volatile manner, and a comparison circuit for comparing retrieval data with storage information in data retrieve operation in order to determine whether or not the retrieval data matches the storage information. The comparison circuit includes a storage section for temporarily storing the storage information. A control circuit is provided in order to transfer the storage information from the memory block to the storage section. Since the storage information is stored in the memory block, storage data of a memory cell is stored in a non-volatile manner even if supply of a power supply voltage is discontinued. This ensures stable comparison operation in the comparison circuit.

According to still another aspect of the present invention, a non-volatile memory device includes a plurality of memory cells arranged in a matrix, a plurality of word lines, a plurality of bit lines, a selection circuit, and a control circuit. Each of the plurality of memory cells has an electric resistance varying according to storage data written in a non-volatile manner by a data write current. The plurality of word lines are provided corresponding to memory cell rows. The plurality of bit lines are provided corresponding to memory cell columns. The selection circuit selects a memory cell row and a memory cell column. The control circuit continuously conducts data write operation or data read operation to or from a memory cell group of the memory cell row or the memory cell column selected by the selection circuit.

The non-volatile memory device of the present invention includes a control circuit for continuously conducting data write operation or data read operation to or from a memory cell row or a memory cell column. This enables improvement in speed of data read operation and data write operation.

According to yet another aspect of the present invention, a non-volatile memory device includes a plurality of memory cells arranged in a matrix, a plurality of word lines, a plurality of bit lines, and a control circuit. Each of the plurality of memory cells has an electric resistance varying according to storage data written in a non-volatile manner by a data write current. The plurality of word lines are provided corresponding to memory cell rows. The plurality of bit lines are provided corresponding to memory cell columns. The control circuit divides each of data write operation and data read operation into a plurality of cycles and conducts the plurality of cycles by pipeline processing.

The non-volatile memory device of the present invention includes a control circuit for dividing each of data write operation and data read operation into a plurality of stages and conducting the plurality of stages by pipeline processing. This enables further improvement in speed of data read operation and data write operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
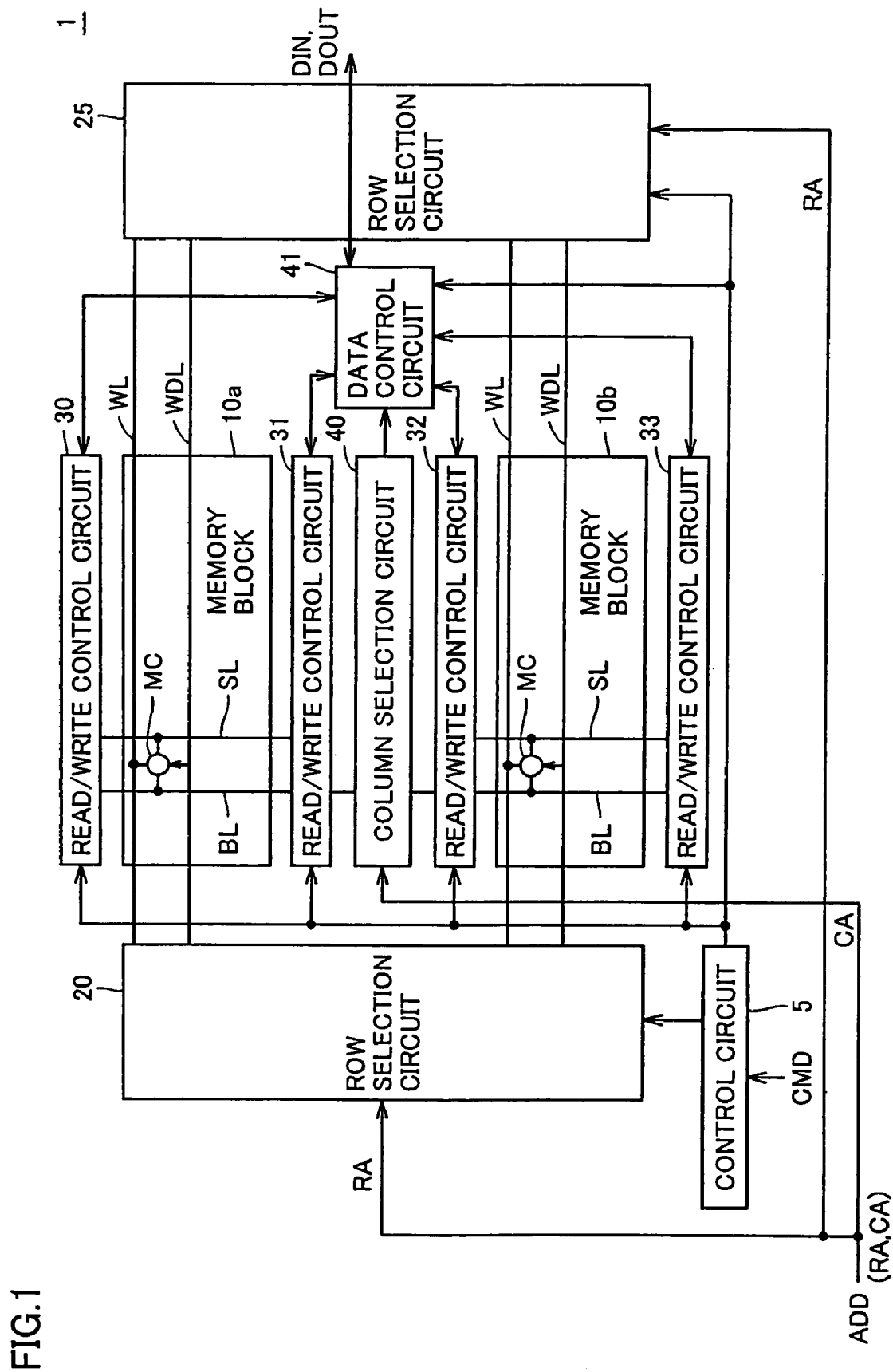
FIG. 1 is a schematic block diagram showing the overall structure of an MRAM device shown as a typical example of a non-volatile memory device according to a first embodiment of the present invention.

Hereinafter, embodiments of the present invention will be described in detail with reference to the accompanying drawings. Note that the same or corresponding portions are denoted with the same reference numerals and characters throughout the figures, and description thereof will not be repeated.

First Embodiment

Referring to FIG. 1, an MRAM device 1 is shown as a typical example of a non-volatile memory device according to the first embodiment of the present invention. MRAM device 1 includes a control circuit 5 and memory blocks 10a, 10b. Control circuit 5 controls the overall operation of MRAM device 1 in response to a control signal CMD. Each memory block 10a, 10b includes MTJ memory cells arranged in a matrix.

As is apparent from the following description, the present invention is not limited to an MRAM device including MTJ memory cells. The present invention is similarly applicable to a non-volatile memory device including memory cells each having an electric resistance varying in a non-volatile manner according to the storage data level written by a data write current.

A plurality of tunneling magneto-resistance elements TMR are arranged in a matrix in each memory block 10a, 10b. The rows and columns of the plurality of tunneling magneto-resistance elements TMR in each memory block 10a, 10b are herein sometimes referred to memory cell rows and memory cell columns, respectively. In the present embodiment, it is assumed that various operations are conducted in synchronization with a clock signal CLK. Although not shown in the figures, clock signal CLK is generated within control circuit 5 and is output to each internal circuit.

Since the structure and the data storage principles of tunneling magneto-resistance element TMR are the same as those described in connection with FIGS. 21 to 25, detailed description thereof will not be repeated. Each tunneling magneto-resistance element TMR stores one of "H" level ("1") and "L" level ("0") as storage data. The electric resistance of each tunneling magneto-resistance element TMR varies according to the level of the storage data.

FIG. 1 exemplarily shows a single MTJ memory cell MC, and a corresponding word line WL, write digit line WDL, bit line BL and source line SL in each memory block 10a, 10b. Word lines WL and writ digit lines WDL are provided along the row direction. Bit lines BL and source lines SL are provided along the column direction.

MRAM device 1 further includes row selection circuits 20, 25, read/write control circuits 30 to 33, a column selection circuit 40, and a data control circuit 41.

Row selection circuits 20, 25 select a row in memory blocks 10a, 10b which are selectively accessed based on a row address RA. Column selection circuit 40 selects a column in memory blocks 10a, 10b which are selectively accessed based on a column address CA.

Read/write control circuits 30, 31 control data read operation, data write operation and data retrieve operation in memory block 10a. Similarly, read/write control circuits 32, 33 control data read operation, data write operation and data retrieve operation in memory block 10b. More specifically, in data write operation, a data write current of the row direction is applied to a write digit line WDL of a memory cell row corresponding to a selected memory cell (hereinafter, sometimes referred to as "selected row"), and a data write current of the column direction is applied to a bit line BL of a memory cell column corresponding to the selected memory cell (hereinafter, referred to as "selected column"). In data read operation, a word line WL corresponding to a selected memory cell is activated, and a data read current flows through the selected memory cell and a corresponding bit line BL. In data retrieve operation, a word line WL corresponding to a selected memory cell row is activated, and a data retrieval current (corresponding to the data read current) flows through a plurality of selected memory cells of a selected memory cell row and corresponding bit lines BL.

Data control circuit 41 controls input and output of data such as input data (write data) DIN and output data (read data) DOUT, and transmits the data to internal circuitry or outputs the data to the outside.

Hereinafter, binary voltage states of a signal, a signal line, data and the like (i.e., a high-voltage state (power supply voltage Vcc1, Vcc2) and a low-voltage state (ground voltage GND)) are sometimes referred to as "H level" and "L level", respectively.

Figure 2:
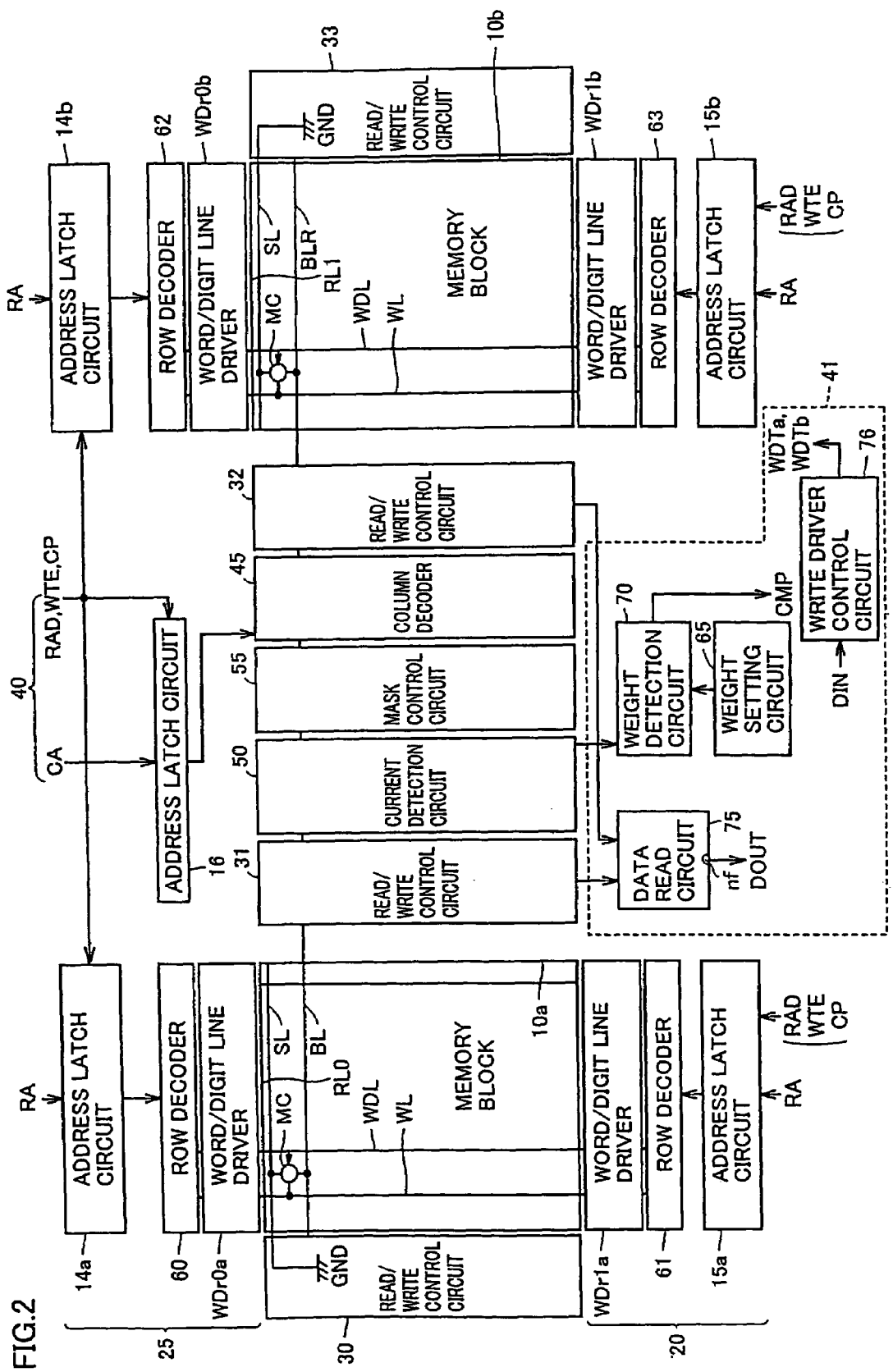
FIG. 2 is a conceptual diagram of peripheral circuitry of memory blocks.

Referring to FIG. 2, in the peripheral circuitry of memory blocks 10a, 10b, row selection circuit 20 includes an address latch circuit 15a, a row decoder 61, a word/digit line driver WDr1a, an address latch circuit 15b, a row decoder 63, and a word/digit line driver WDr1b. Address latch circuit 15a, row decoder 61 and word/digit line driver WDr1a are provided for memory block 10a. Address latch circuit 15b, row decoder 63, and word/digit line driver WDr1b are provided for memory block 10b. Similarly, row selection circuit 25 includes an address latch circuit 14a, a row decoder 60, a word/digit line driver WDr0a, an address latch circuit 14b, a row decoder 62, and a word/digit line driver WDr0b. Address latch circuit 14a, row decoder 60 and word/digit line driver WDr0a are provided for memory block 10a. Address latch circuit 14b, row decoder 62, and word/digit line driver WDr0b are provided for memory block 10b.

Each address latch circuit 14a, 15a, 14b, 15b temporarily holds a row address RA, and outputs the row address RA to a corresponding row decoder 60 to 63 in synchronization with clock signal CLK. Each row decoder 60, 61 decodes row address RA latched in a corresponding address latch circuit 14a, 15a, holds the decode result in a not-shown internal latch circuit, and transmits the decode result to a corresponding word/digit line driver WDr0a, WDr1a. Similarly, each row decoder 62, 63 decodes row address RA latched in a corresponding address latch circuit 14b, 15b, holds the decode result in a not-shown internal latch circuit, and transmits the decode result to a corresponding word/digit line driver WDr0b, WDr1b.

Each word/digit line driver WDr0a, WDr1a activates a word line WL and a write digit line WDL in memory block 10a based on the decode result of a corresponding row decoder 60, 61. Each word/digit line driver WDr0b, WDr1b activates a word line WL and a write digit line WDL in memory block 10b based on the decode result of a corresponding row decoder 62, 63.

Column selection circuit 40 includes an address latch circuit 16, a column decoder 45, a mask control circuit 55, and a current detection circuit 50. Mask control circuit 55 conducts mask control in bit lines BL of memory blocks 10a, 10b in data retrieve operation. The mask control and the data retrieve operation will be described later. Current detection circuit 50 compares retrieval data with storage data in order to determine whether or not the retrieval data matches the storage data.

Address latch circuit 16 temporarily holds a column address CA, and outputs the column address CA to column decoder 45 in synchronization with clock signal CLK.

Column decoder 45 decodes column address CA latched in address latch circuit 16, holds the decode result in a not-shown internal latch circuit, and selects a column, that is, a bit line, in memory blocks 10a, 10b based on the column address CA.

Data control circuit 41 includes a data read circuit 75, a write driver control circuit 76, a weight setting circuit 65, and a weight detection circuit 70. In data read operation, data read circuit 75 is inputted data from read/write control circuits 31, 32, and outputs the data to the outside as read data DOUT. In data write operation, write driver control circuit 76 outputs data write control signals WDTa, WDTb based on input data DIN to read/write control circuits 30 to 33. Weight setting circuit 65 sets a reference current to be compared with the retrieval result which is output from current detection circuit 50 in data retrieve operation. In data retrieve operation, weight detection circuit 70 generates the comparison result CMP between the retrieval result from current detection circuit 50 and the reference current from weight setting circuit 65. Read data DOUT is output from a data output node nf of data read circuit 75.

Figure 3:
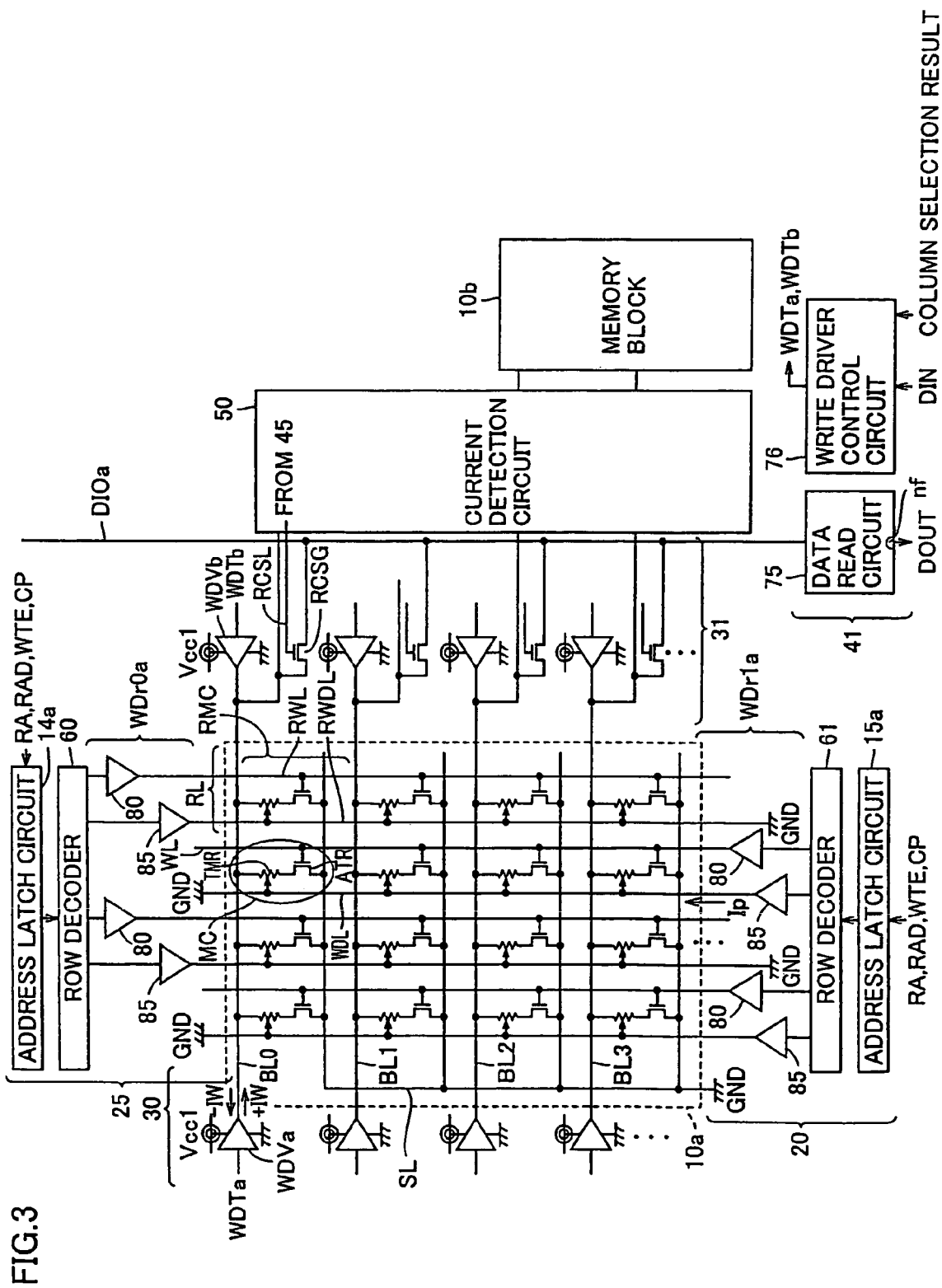
FIG. 3 is a circuit diagram specifically showing the peripheral circuitry of a memory block.

Referring to FIG. 3, memory block 10a has MTJ memory cells MC arranged in a matrix. FIG. 3 exemplarily shows MTJ memory cells MC arranged in four rows by four columns in memory block 10a. As described before, word lines WL and write digit lines WDL are provided corresponding to the memory cell rows, and bit lines BL and source lines SL are provided corresponding to the memory cell columns. Each MTJ memory cell MC has the same structure as that described in connection with FIG. 21. Each MTJ memory cell MC includes a tunneling magneto-resistance element TMR and an access transistor ATR which are connected in series between a corresponding bit line BL and a corresponding source line SL.

As described before, each tunneling magneto-resistance element TMR has an electric resistance corresponding to the magnetization direction. Before data read operation, tunneling magneto-resistance element TMR in each MTJ memory cell MC is magnetized in a predetermined direction in order to store "H"-level ("1") or "L"-level ("0") data. Therefore, the electric resistance of tunneling magneto-resistance element TMR is set to Rmax or Rmin according to the storage data level.

Each source line SL is coupled to ground voltage GND. Accordingly, the source voltage of each access transistor ATR is electrically coupled to ground voltage GND in read/write control circuit 30. As a result, in a selected row corresponding to a word line WL activated to "H" level, each tunneling magneto-resistance element TMR is pulled down to ground voltage GND and connected to a corresponding bit line BL.

Memory block 10a further includes a plurality of retrieval cells RMC arranged in a retrieval row RL. Retrieval cells RMC are provided as memory cells selected to be retrieved in data retrieve operation. Each retrieval cell RMC has the same structure and characteristics as those of MTJ memory cell MC. Accordingly, MTJ memory cells corresponding to a single row are provided in addition to the MTJ memory cells serving as valid bits. These additional MTJ memory cells are used as retrieval cells RMC.

The use of retrieval cells RMC having the same structure and shape as those of MTJ memory cells MC eliminates the need for special design and a special manufacturing process for the retrieval cells. Since the manufacturing process is not complicated, the retrieval cells can be manufactured without causing increase in chip area, reduction in processing margin of the memory array, and the like. Especially, the use of such retrieval cells RMC ensures continuity of the structure in memory block 10a. This contributes to stabilization of manufacturing characteristics of MTJ memory cells MC and retrieval cells RMC.

Retrieval cells RMC share the memory cell columns with MTJ memory cells MC. A retrieval word line RWL and a retrieval write digit line RWDL are provided corresponding to retrieval row RL.

Each retrieval cell RMC has a tunneling magneto-resistance element TMR and an access transistor ATR which are connected in series between a corresponding bit line BL and a corresponding source line SL. In each retrieval cell RMC, the gate of access transistor ATR is connected to retrieval word line RWL. Although the structure of memory block 10a has been described above, memory block 10b also has the same structure as that of memory block 10a.

Row selection circuits 20, 25 have a word line driver 80 and a write digit line driver 85 in every memory cell row. Although not shown in the figure, each word line driver 80 receives power supply voltage Vcc2 and ground voltage GND, and each write digit line driver 85 receives power supply voltage Vcc1 and ground voltage GND. Power supply voltage Vcc1 is higher than power supply voltage Vcc2. In other words, |(Vcc1−GND)|>|(Vcc2−GND)|.

Each word line driver 80 is provided at one end of a corresponding word line WL, and controls activation of the corresponding word line WL based on the decode result of a memory cell row from a corresponding row decoder 60, 61. More specifically, word line driver 80 connects a corresponding word line WL to power supply voltage Vcc2 ("H" level) in order to activate the world line WL. On the other hand, word line driver 80 connects the corresponding word line WL to ground voltage GND in order to inactivate the word line WL.

Each write digit line driver 85 is provided at one end of a corresponding write digit line WDL, and controls activation of the corresponding write digit line WDL based on the decode result of a memory cell row from a corresponding row decoder 60, 61. More specifically, write digit line driver 85 connects a corresponding write digit line WDL to power supply voltage Vcc1 ("H" level) in order to activate the write digit line WDL. On the other hand, write digit line driver 85 connects the corresponding write digit line WDL to ground voltage GND in order to inactivate the write digit line WDL.

When a memory cell row is selected according to a row address RA, row decoder 60, 61 sets a corresponding write digit line WDL to "H" level (power supply voltage Vcc1) and sets the other write digit lines WDL to "L" level (ground voltage GND).

The other end of each write digit line WDL is connected to ground voltage GND. Accordingly, in data write operation, a data write current Ip is applied to an activated write digit line WDL in the direction from write digit line driver 85 toward ground voltage GND.

On the other hand, in data read operation, word line driver 80 activates a corresponding word line WL based on the decode result of a corresponding memory cell row. In response to this, access transistors ATR of the selected row are turned ON, and corresponding tunneling magneto-resistance elements TMR are electrically coupled between respective bit lines BL and respective source lines SL. Row selection operation is thus conducted in memory block 10a.

The same structure is provided for word line WL and write digit line WDL of each memory cell row. As shown in FIG. 3, word line drivers 80 and write digit line drivers 85 are arranged in a staggered manner in each memory cell row. More specifically, word line driver 80 and write digit line driver 85 are alternately provided in every row so that word line driver 80 and write digit line driver 85 corresponding to one memory cell row are provided at one end of word line WL and write digit line WDL, and word line driver 80 and write digit line driver 85 corresponding to an adjacent memory cell row are provided at the other end of word line WL and write digit line WDL. This enables row selection circuits 20, 25 to be efficiently arranged with small area.

Data control circuit 41 includes write driver control circuit 76. Write driver control circuit 76 operates in response to an instruction from control circuit 5. In operation, write driver control circuit 76 sets data write control signals WDTa, WDTb of each memory cell column according to input data DIN and the column selection result from column decoder 45.

Read/write control circuit 30 includes a write driver WDVa in every memory cell column. Similarly, read/write control circuit 31 includes a write driver WDVb in every memory cell column. In each memory cell column, write driver WDVa drives one end of a corresponding bit line BL with either power supply voltage Vcc1 or ground voltage GND according to a corresponding data write control signal WDTa. Similarly, in each memory cell column, write driver WDVb drives the other end of a corresponding bit line BL with either power supply voltage Vcc1 or ground voltage GND according to a corresponding data write control signal WDTb.

In data write operation, data write control signals WDTa, WDTb corresponding to a selected column are respectively set to "H" level and "L" level, or "L" level and "H" level, according to the write data level. For example, when "H"-level ("1") data is to be written, data write control signal WDTa is set to "H" level and data write control signal WDTb is set to "L" level in order to apply a data write current +Iw in the direction from write driver WDVa toward write driver WDVb. On the other hand, when "L"-level ("0") data is to be written, data write control signal WDTb is set to "H" level and data write control signal WDTa is set to "L" level in order to apply a data write current −Iw in the direction from write driver WDVb toward write driver WDVa. Hereinafter, data write currents +Iw, −Iw of different directions are sometimes generally referred to as "data write current ±Iw".

In the non-selected columns, data write control signals WDTa, WDTb are set to "L" level.

Accordingly, by applying a data write current ±Iw and a data write current ±Iw to a write digit line WDL and a bit line BL, respectively, write data corresponding to the direction of data write current ±Iw is magnetically written to a tunneling magneto-resistance element TMR corresponding to this write digit line WDL and this bit line BL. The same structure is provided for bit line BL of each memory cell column.

Read/write control circuit 31 further includes a data line DIOa and column selection gates RCSG. Data line DIOa transmits a voltage corresponding to the electric resistance of a selected memory cell. Each column selection gate RCSG is provided between data line DIOa and a corresponding bit line BL. Read column selection lines RCSL are provided corresponding to column selection gates RCSG. Each read column selection line RCSL indicates the selection state of a corresponding memory cell column, and is coupled to the gate of a corresponding column selection gate RCSG. Each read column selection line RCSL is activated to "H" level when a corresponding memory cell column is selected. The same structure is provided in each memory cell column. In other words, data line DIOa is shared by bit lines BL in memory block 10a.

With the above structure, the selected memory cell is electrically coupled to data line DIOa through a bit line BL of the selected column and a corresponding column selection gate RCSG in data read operation.

Data control circuit 41 includes data read circuit 75.

Data read circuit 75 is electrically coupled to data line DIOa. In data read operation, data read circuit 75 amplifies read data by a not-shown internal sense amplifier, and output the amplified read data to the outside. More specifically, in data read operation, data read circuit 75 amplifies the difference between the voltage level on data line DIOa corresponding to the storage data of the selected memory cell and a predetermined reference voltage level in order to cause the read data to transition to either "H" level or "L" level. Data read circuit 75 thus outputs the read data DOUT from data output node nf.

Figure 4:
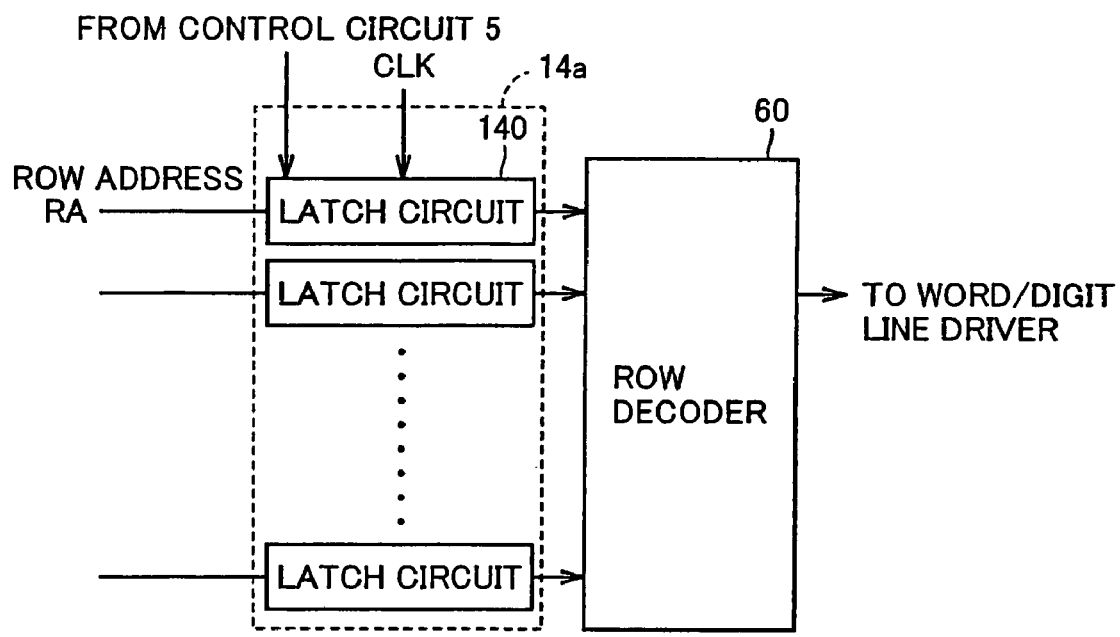
FIG. 4 is a conceptual diagram of an address latch circuit.

Referring to FIG. 4, address latch circuit 14a has a plurality of latch circuits 140 arranged in parallel. Each latch circuit 140 holds a one-bit row address RA in synchronization with a control signal and clock signal CLK from control circuit 5, and outputs the one-bit row address RA to row decoder 60. Similarly, the other address latch circuits 14b, 15a, 15b each holds a row address RA in synchronization with a control signal and clock signal CLK from control circuit 5, and outputs the row address RA to a corresponding row decoder 62, 61, 63. Address latch circuit 16 corresponding to column decoder 45 also has the same structure. Therefore, address latch circuit 16 holds a column address CA in synchronization with a control signal and clock signal CLK from control circuit 5, and outputs the column address CA to column decoder 45.

Figure 5:
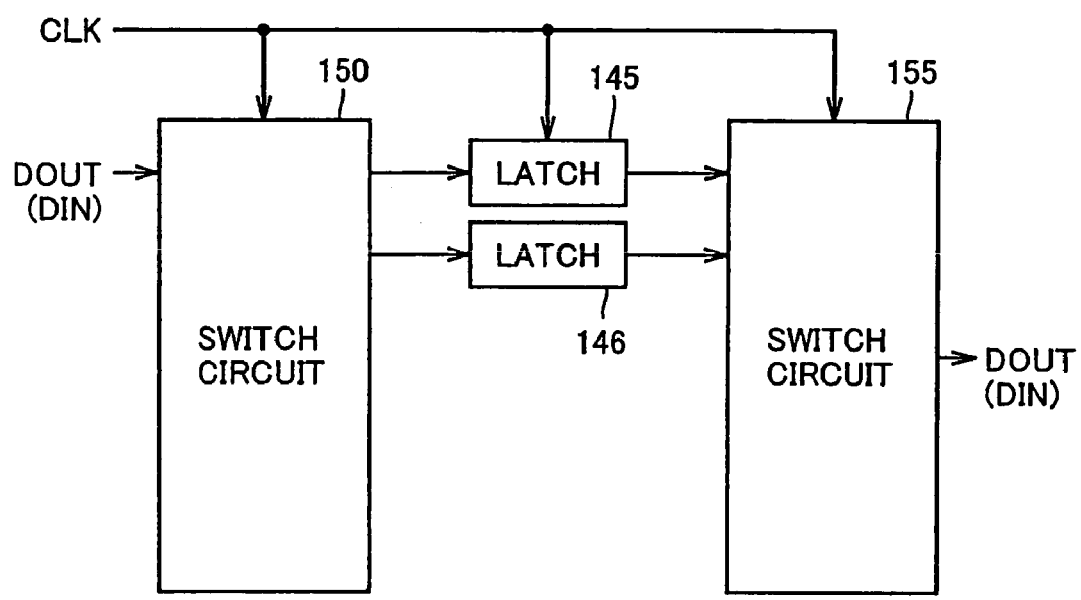
FIG. 5 is a conceptual diagram of a data latch circuit in data read operation.

The data latch circuit shown in FIG. 5 is provided in data read circuit 75, and receives a signal from the not-shown sense amplifier for amplifying read data DOUT within data read circuit 75.

Referring to FIG. 5, a switch circuit 150 receives read data DOUT amplified by the not-shown sense amplifier, and selectively switches between latch circuits 145 and 146 in order to output the read data DOUT to latch circuit 145, 146 in synchronization with clock signal CLK. Latch circuits 145, 146 selectively hold the read data DOUT received through switch circuit 150 in synchronization with clock signal CLK. A switch circuit 155 selectively switches between latch circuits 145 and 146 in order to output the read data DOUT to the outside in synchronization with clock signal CLK.

Although the structure of the data latch circuit for outputting read data DOUT within data read circuit 75 is described above, a data latch circuit having the same structure is also provided within write driver control circuit 76. More specifically, when input (write) data DIN is applied to write driver control circuit 76, write driver control circuit 76 holds the write data DIN in the data latch circuit in synchronization with clock signal CLK, and selectively switches between latch circuits by a switch circuit in order to output the write data DIN in synchronization with clock signal CLK.

Hereinafter, data retrieve operation in the MRAM device of the first embodiment will be described.

In the example described below, the data in memory block 10a is regarded as storage data, and the data written to the retrieval row of memory block 10b is regarded as retrieval data. In data retrieve operation of the present invention, the storage data is compared with the retrieval data in order to determine whether or not the storage data and the retrieval data of the same column match each other. It is herein assumed that storage data is pre-stored in every memory cell row of memory block 10a, and retrieval data is stored (applied) to the retrieval row of memory block 10b.

Figure 6:
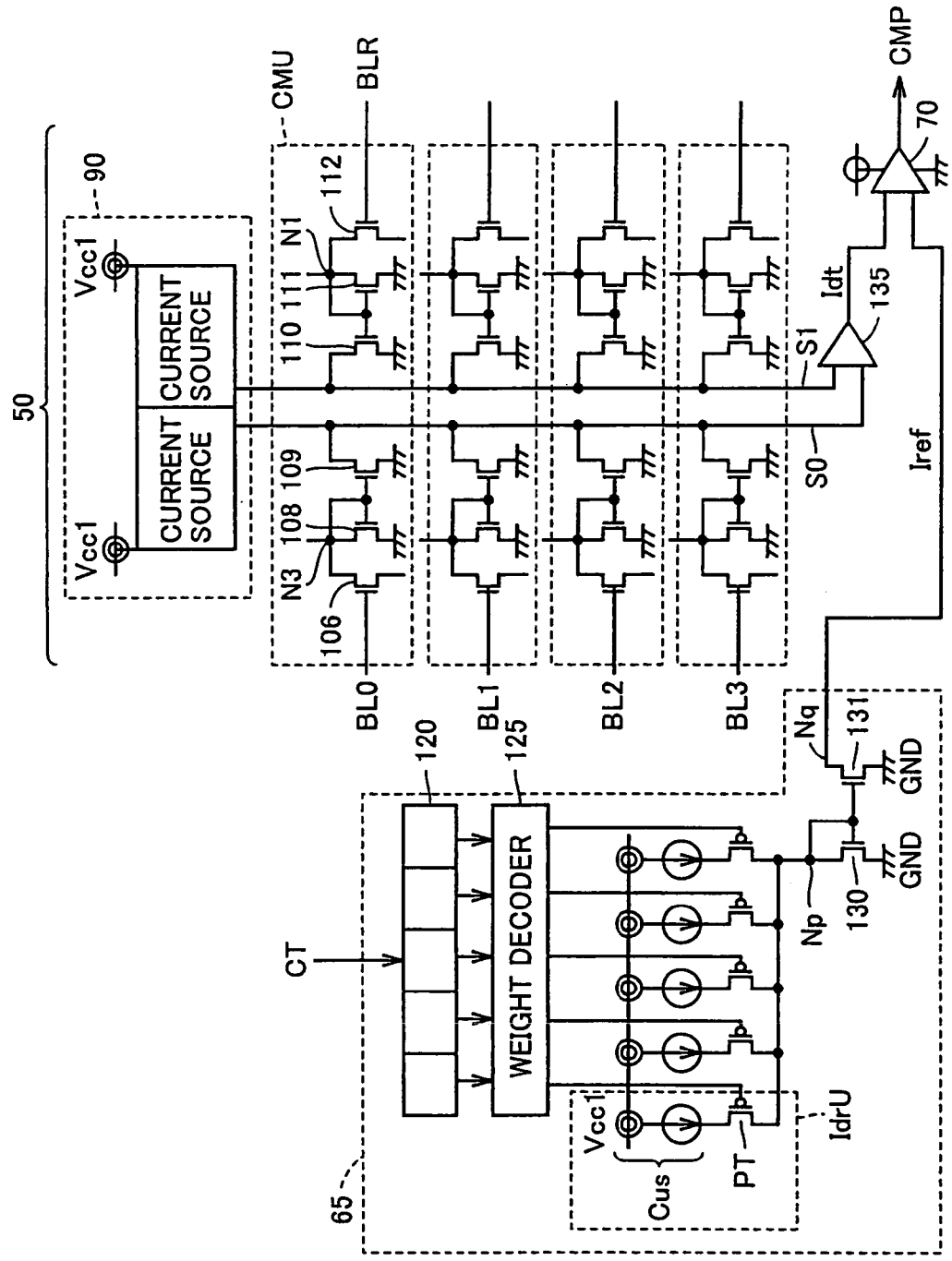
FIG. 6 is a conceptual diagram of a circuit group for conducting data retrieve operation.

Referring to FIG. 6, a circuit group for conducting data retrieve operation includes current detection circuit 50, weight detection circuit 70, and weight setting circuit 65.

Current detection circuit 50 includes a current supply source 90, current comparison units CMU, and a current adder 135. Current supply source 90 supplies a constant current to sense lines S0, S1. Current comparison unit CMU is provided in each column, and compares a retrieval data level with a storage data level. Current adder 135 generates a current Idt, the sum of the current amounts flowing through sense lines S0, S1.

Weight setting circuit 65 includes a latch circuit 120, a weight decoder 125, and a plurality of current source units IdrU. Latch circuit 120 receives a control signal CT of a plurality of bits, and holds bit information of the control signal CT. Weight decoder 125 generates a decode signal for adjusting a reference current according to the bit information held in latch circuit 120. The plurality of current source units IdrU are capable of supplying a current to a node Np in parallel. Each current source unit IdrU has a current source Cus and a P-channel MOS (Metal Oxide Semiconductor) transistor PT. Each transistor PT supplies a current from a corresponding current source Cus to node Np in response to a decode signal from weight decoder 125. More specifically, each transistor PT supplies a current from a corresponding current source Cus to node Np in response to the decode signal ("L" level). Accordingly, a current to be supplied to node Np can be adjusted according to the decode signal from weight decoder 125.

A transistor 130 is provided between node Np and ground voltage GND, and has its gate electrically coupled to node Np. A transistor 131 is provided between ground voltage GND and a node Nq, and has its gate electrically coupled to node Np. Transistors 130, 131 thus form a current mirror circuit. As a result, the same current amount as that passing through transistor 130 is applied through transistor 131 to node Nq as a reference current Iref.

Weight detection circuit 70 compares current Idt from current adder 135 with reference current Iref from weight setting circuit 65, and outputs the comparison result CMP. More specifically, weight detection circuit 70 determines whether or not current Idt from current detection circuit 50 is greater than reference current Iref. For example, it is possible to set the comparison result CMP to "H" level if current Idt is equal to or greater than reference current Iref, and to set the comparison result CMP to "L" level if current Idt is less than reference current Iref.

Figure 7:
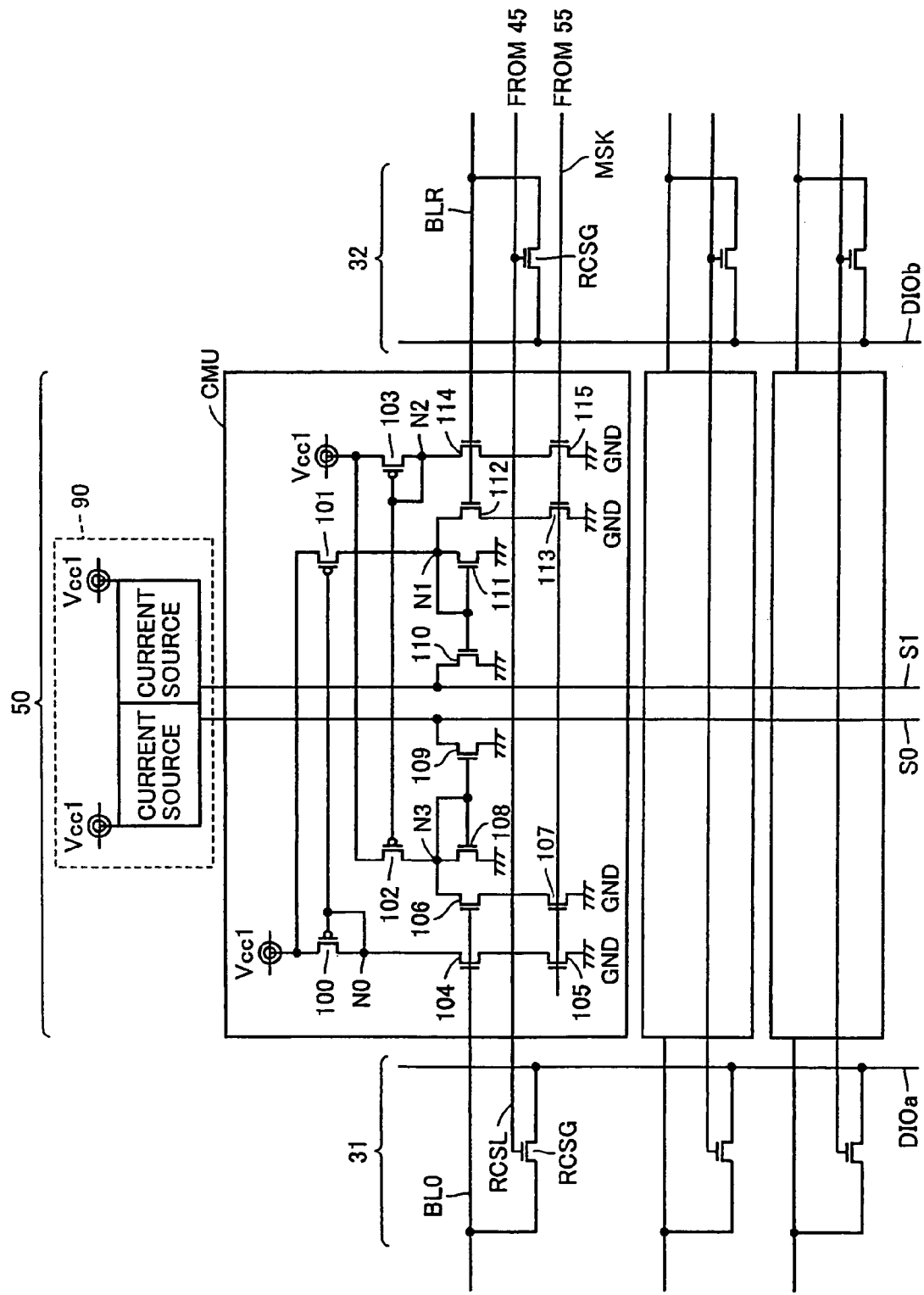
FIG. 7 shows the circuit structure of a current comparison unit.

Referring to FIG. 7, each current comparison unit CMU in current detection circuit 50 of the first embodiment includes transistors 100 to 115. Transistor 100 is provided between power supply voltage Vcc1 and a node N0, and has its gate electrically coupled to node N0. Transistor 101 is provided between power supply voltage Vcc1 and a node N1, and has its gate electrically coupled to node N0. Transistor 102 is provided between a node N3 and power supply voltage Vcc1, and has its gate electrically coupled to a node N2. Transistor 103 is provided between power supply voltage Vcc1 and node N2, and has its gate electrically coupled to node N2. Transistors 104, 105 are connected in parallel between node N0 and ground voltage GND, and have their gates electrically coupled to a bit line BL0 and a selection line MSK from mask control circuit 55, respectively. Transistors 106, 107 are connected in series between node N3 and ground voltage GND, and have their gates electrically coupled to bit line BL0 and selection line MSK from mask control circuit 55, respectively. Transistor 108 is provided between node N3 and ground voltage GND, and has its gate electrically coupled to node N3. Transistor 109 is provided between sense line S0 and ground voltage GND, and has is gate electrically coupled to node N3.

Transistor 110 is provided between sense line S1 and ground voltage GND, and has its gate electrically coupled to node N1. Transistor 111 is provided between node N1 and ground voltage GND, and has its gate electrically coupled to node N1. Transistors 112, 113 are provided between node N1 and ground voltage GND, and have their gates electrically coupled to a bit line BLR and selection line MSK from mask control circuit 55, respectively. Transistors 114, 115 are provided between node N2 and ground voltage GND, and have their gates electrically coupled to bit line BLR and selection line MSK from mask control circuit 55, respectively. In this example, a bit line for storage data is referred to as bit line BL0, and a bit line for retrieval data is referred to as bit line BLR. Although transistors 100 to 103 are P-channel MOS transistors and transistors 104 to 115 are N-channel MOS transistors in this example, the present invention is not limited to this.

Although the structure of one of current comparison units CMU is described above, the other current comparison units CMU have the same structure. Therefore, description thereof will not be repeated.

Figure 8:
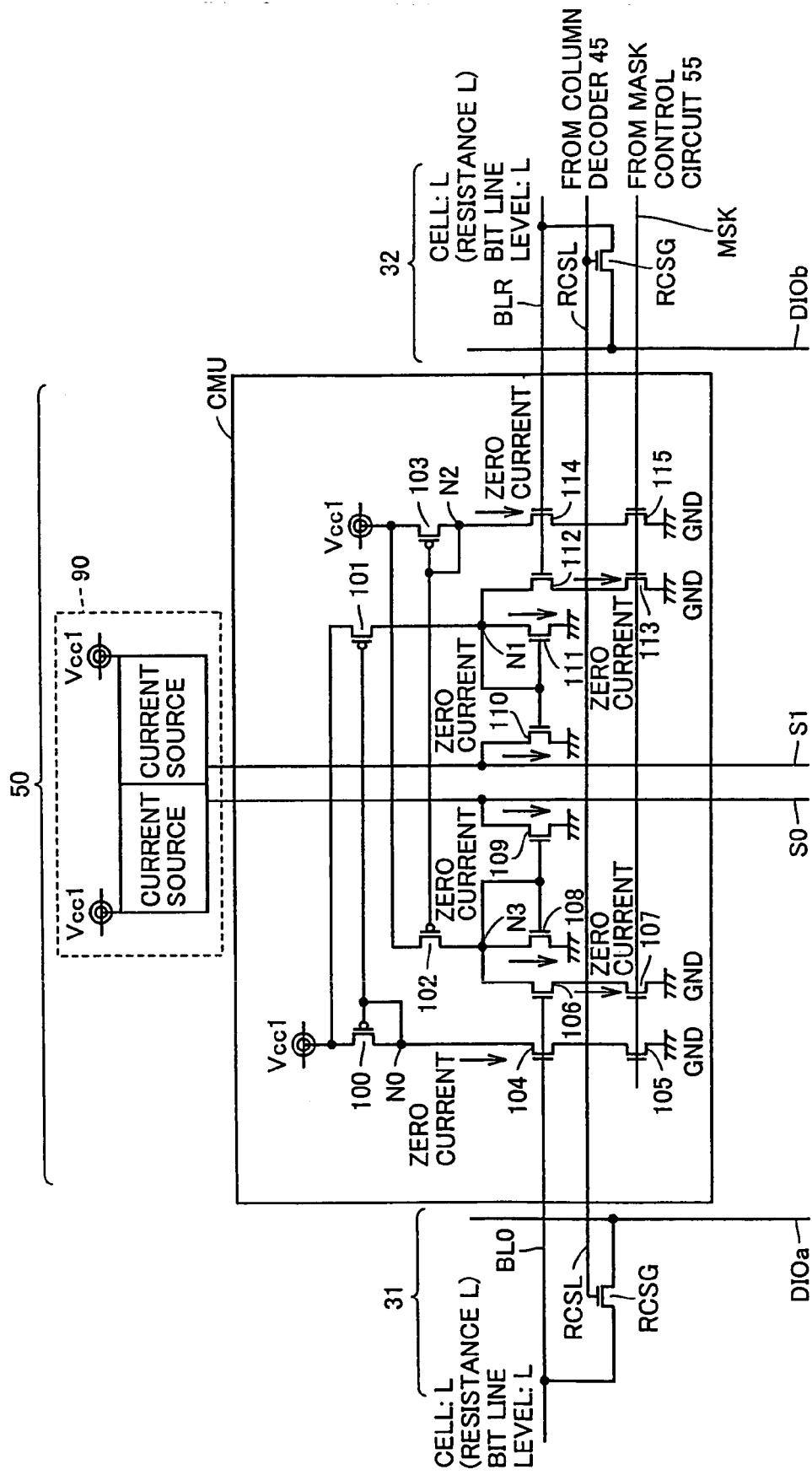
FIG. 8 is a conceptual diagram illustrating a data retrieve operation in a current detection circuit.

Hereinafter, a data retrieve operation in current detection circuit 50 will be described with reference to FIG. 8.

In this example, one-bit storage data pre-stored in memory block 10a is compared with one-bit retrieval data stored in the retrieval row of memory block 10b, and selection line MSK from mask control circuit 55 is set to "H" level. The same applies to the examples of data retrieve operation described later.

It is herein assumed that bit line BLR for retrieval data is at "L" level and bit line BL of the selected row in memory block 10a storing storage data is at "L" level. Transistors 100, 101 form a current mirror. The current amount passing through transistors 110, 111 is determined according to the voltage level on bit line BL0 which is applied to transistor 104. Similarly, transistors 102, 103 form a current mirror. The current amount passing through transistors 108, 109 is determined according to the voltage level on bit line BLR which is applied to transistor 114.

Since the gate of transistor 104 is at "L," level, no current flows through the current mirror formed by transistors 110, 111. In other words, no current path is formed from current supply source 90 to ground voltage GND through transistor 110. Since the gate of transistor 114 is at "L" level, no current flows through the current mirror formed by transistors 108, 109. In other words, no current path is formed from current supply source 90 to ground voltage GND through transistor 109.

Accordingly, a predetermined current amount supplied from current supply source 90 through sense lines S0, S1 does not vary when it flows through this current comparison unit CMU.

Figure 9:
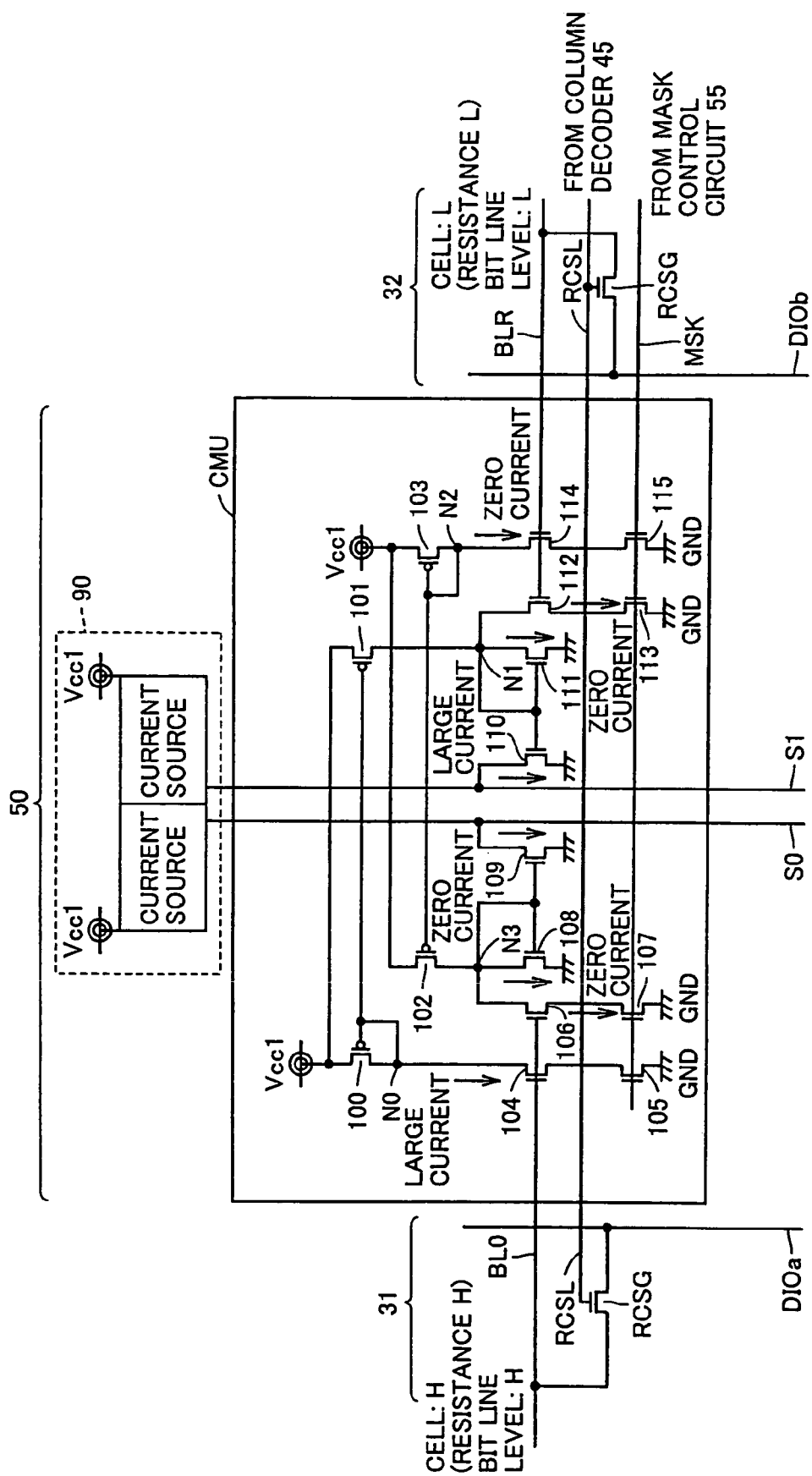
FIG. 9 is a conceptual diagram illustrating another data retrieve operation in the current detection circuit.

Hereinafter, another data retrieve operation in current detection circuit 50 will be described with reference to FIG. 9.

It is herein assumed that bit line BL0 is at "H" level and bit line BLR is at "L" level. In this case, the gate of transistor 104 is at "H" level. Therefore, a large current flows through the current mirror formed by transistors 110, 111. In other words, a current path is formed from current supply source 90 to ground voltage GND through transistor 110. On the other hand, the gate of transistor 114 is at "L" level. Therefore, no current flows through the current mirror formed by transistors 108, 109. In other words, no current path is formed from current supply source 90 to ground voltage GND through transistor 109.

Accordingly, the predetermined current amount supplied from current supply source 90 through sense lines S0, S1 is reduced when it flows through this current comparison unit CMU. More specifically, the current supplied from current supply source 90 through sense line S1 is reduced by the large current flowing through the current mirror.

Figure 10:
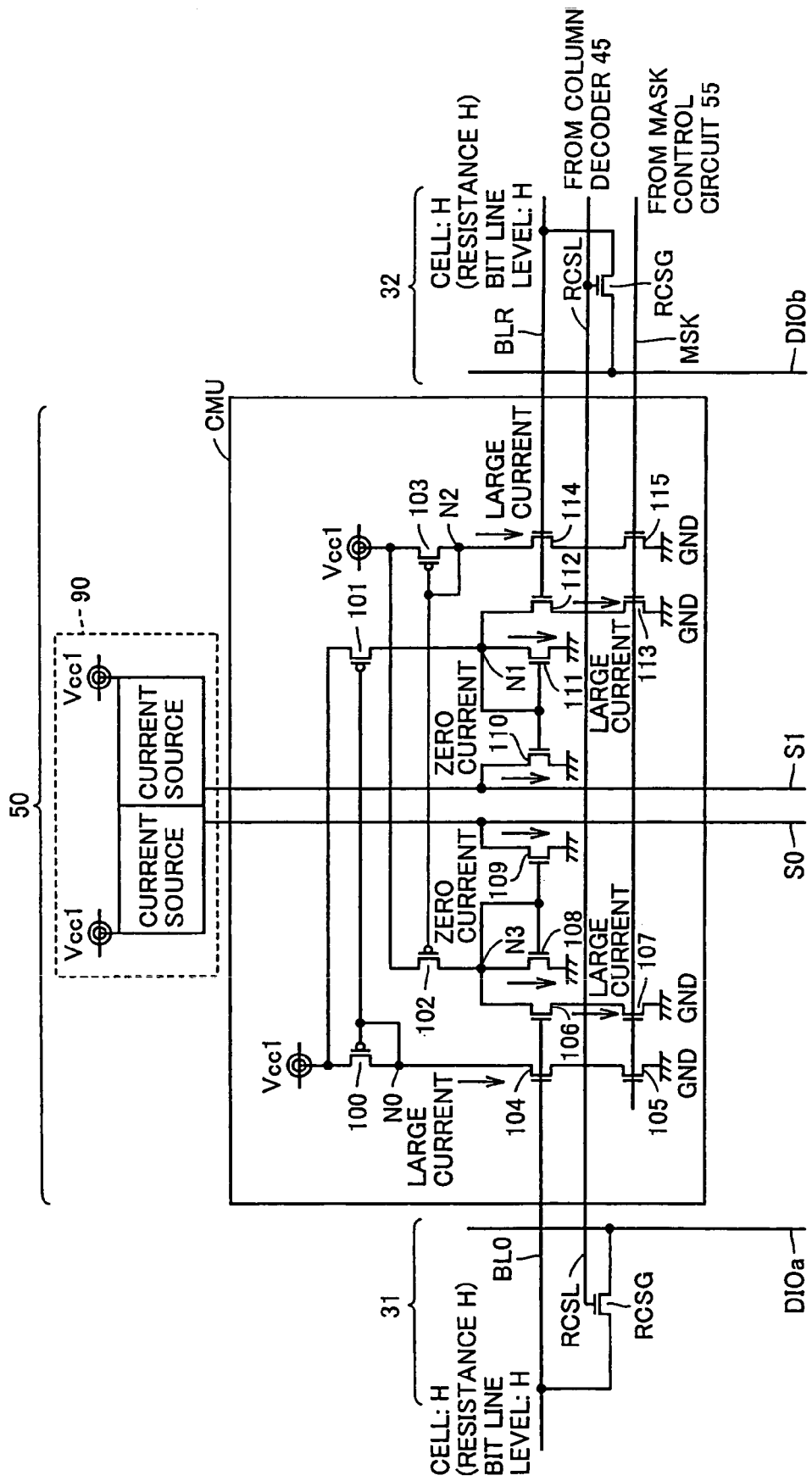
FIG. 10 is a conceptual diagram illustrating still another data retrieve operation in the current detection circuit.

Hereinafter, still another data retrieve operation in current detection circuit 50 will be described with reference to FIG. 10.

It is herein assumed that bit line BL0 and bit line BLR are both at "H" level. In this case, the gate of transistor 104 is at "H" level. Therefore, a large current is supposed to flow through the current mirror formed by transistors 110, 111. However, transistors 112, 113 are turned ON in response to "H" level on bit line BLR. In other words, node N1 is pulled down to ground voltage GND through transistors 112, 113. Accordingly, transistor 110 is turned OFF, and no current path is formed from current supply source 90 to ground voltage GND through transistor 110.

Since the gate of transistor 114 is at "H" level, a large current is supposed to flow through the current mirror formed by transistors 108, 109. However, transistors 106, 107 are turned ON in response to "H" level on bit line BL0. In other words, node N3 is pulled down to ground voltage GND through transistors 106, 107. Accordingly, transistor 109 is turned OFF, and no current path is formed from current supply source 90 to ground voltage GND through transistor 109.

Accordingly, the predetermined current amount supplied from current supply source 90 through sense lines S0, S1 does not vary when it flows through this current comparison unit CMU.

Current comparison unit CMU thus compares the voltage level on bit line BL0 of the selected row in memory block 10a storing storage data with the voltage level on bit line BLR for retrieval data. If the voltage level on bit line BL0 matches the voltage level on bit line BLR, no current path to ground voltage GND is formed for sense lines S0, S1 in current comparison unit CMU. On the other hand, if the voltage level on bit line BLR does not match the voltage level on bit line BLR, a current path to ground voltage GND is formed for one of sense lines S0, S1 in current comparison unit CMU. In other words, if the voltage level on bit line BL0 matches the voltage level on bit line BLR, the current from current supply source 90 is maintained without being extracted from sense lines S0, S1. However, if the voltage level on bit line BL0 does not match the voltage level on bit line BLR, a current is extracted from one of sense lines S0, S1. Accordingly, if the retrieval data matches the storage data in terms of every bit (every column) of the selected row, the current amount supplied from current supply source 90 to sense lines S0, S1 flows into current adder 135 without being varied.

If the retrieval data does not match the storage data in terms of at least one bit, a current path is formed in a corresponding bit. Therefore, the current amount flowing into current adder 135 is less than the predetermined current amount.

In this way, the degree to which the retrieval data matches the storage data stored in the selected row (hereinafter, sometimes referred to as "matching ratio" or "hit ratio") can be detected based on the comparison with reference current Iref in the weight comparison circuit. More specifically, the retrieval data and the storage data have a high matching ratio if output current Idt from current adder 135 is greater than reference current Iref. On the other hand, the retrieval data and the storage data have a low matching ratio if output current Idt is smaller than reference current Iref.

By sequentially conducting the above data retrieve operation in each memory cell row of memory block 10a storing storage data, a memory cell row having a high matching ratio can be determined.

Mask control circuit 55 conducts mask control in the data retrieve operation. More specifically, mask control circuit 55 masks a column (bit) corresponding to a retrieval cell of the retrieval row having no retrieval data written therein. In other words, mask control circuit 55 sets a corresponding selection line MSK to "L" level. A current comparison unit CMU corresponding to the "L"-level selection line MSK is inactivated. This enables the data retrieve operation to be conducted only for the same bits as those of the retrieval data. In other words, the data retrieve operation is not conducted for unnecessary bits. This enables improvement in data retrieve operation speed, and thus enables reduction in current consumption required for the operation.

In the data retrieve operation described above, storage data is pre-stored in memory block 10a, and retrieval data is applied (written) to the retrieval row of memory block 10b. However, the present invention is not limited to this. The data retrieve operation can be conducted in the same manner even when storage data is pre-stored in memory block 10b and retrieval data is applied to the retrieval row of memory block 10a. Moreover, the data retrieve operation can be conducted in the same manner even when the same retrieval data is applied to the retrieval row of both memory blocks 10*a*, 10*b* and storage data is pre-stored in both memory blocks 10*a*, 10*b*.

Hereinafter, data read operation, data write operation and data retrieve operation in the MRAM device of the first embodiment will be described with reference to FIG. 11.

Figure 11:
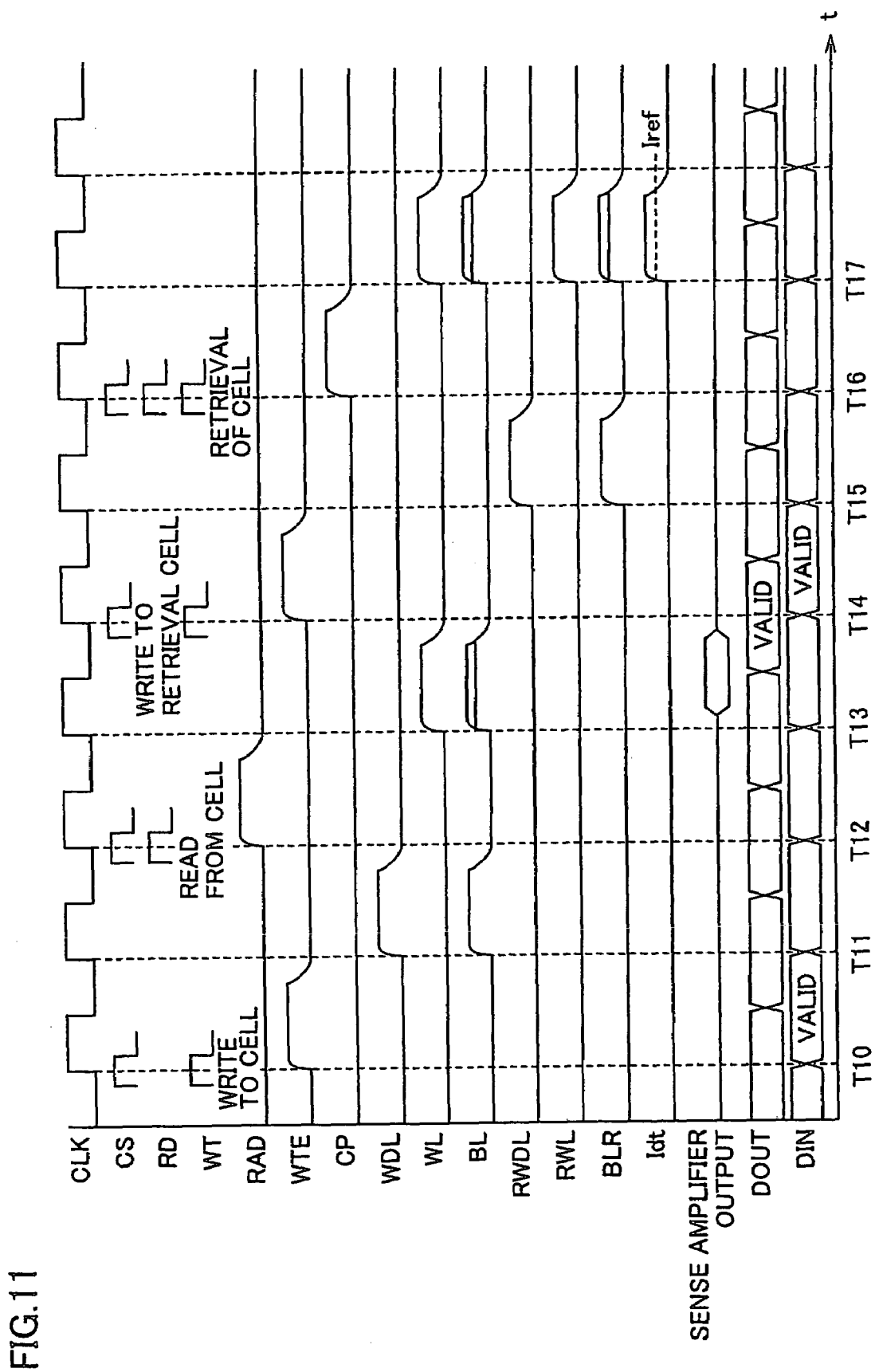
FIG. 11 is a waveform chart illustrating data read operation, data write operation, data retrieve operation and the like in the MRAM device of the first embodiment.

Referring to FIG. 11, a clock signal CLK is repeatedly activated ("H" level) and inactivated ("L" level) on a predetermined cycle. The rising edges of clock signal CLK correspond to time T10 to T17 . . . .

First, data write operation to a selected cell will be described.

At time T10 (corresponding to a rising edge of clock signal CLK), a write control signal WTE is set to "H" level in response to a chip select signal CS and a write command WT. Write control signal WTE is generated by control circuit 5.

At time T10, a row address and a column address are latched in address latch circuits 14*a*, 15*a*, 14*b*, 15*b*, 16 in response to write control signal WTE and clock signal CLK.

A row and a column are selected based on the address information latched at time T10. More specifically, row decoders 60 to 63 and column decoder 45 in FIG. 2 conducts decode operation. The selected memory block and the non-selected memory block are determined based on the address information latched at time T10. Moreover, write data DIN is transferred to the data latch circuit in write driver control circuit 76 and latched therein for the first data write operation. Based on the write data latched in the data latch circuit, write driver control circuit 76 generates data write control signals WDTa, WDTb for the first data write operation. Operation in preparation for supplying a data write current is thus conducted.

At time T11 (corresponding to the following rising edge of clock signal CLK), a write digit line WDL corresponding to the row address latched at time T10 is activated. Data write control signals WDTa, WDTb are respectively transmitted to write drivers WDVa, WDVb of a selected bit line BL corresponding to the column address.

As a result, a data write current for writing write data DIN is applied to the selected write digit line WDL and the selected bit line BL. Write data DIN is thus written to the selected cell.

Hereinafter, data read operation from a selected cell will be described.

At time T12 (corresponding to a rising edge of clock signal CLK), a read control signal RAD is set to "H" level in response to a chip select signal CS and a read command RD. Read control signal RAD is generated by control circuit 5.

At time T12, a row address and a column address are latched in address latch circuits 14*a*, 15*a*, 14*b*, 15*b*, 16 in response to read control signal RAD and dock signal CLK.

A row and a column are selected based on the address information latched at time T12. More specifically, row decoders 60 to 63 and column decoder 45 in FIG. 2 conduct decode operation.

A not-shown precharge circuit completes precharge operation, the operation of precharging each bit line BL to a predetermined voltage before data read operation.

At time T13 (corresponding to the following rising edge of dock signal CLK), a word line WL corresponding to the row address latched at time T12 is activated. Moreover, a read column selection line of a bit line BL corresponding to the column address CA is activated. As a result, a voltage (current) corresponding to storage data Rmax or Rmin of the selected memory cell is generated on the selected bit line BL.

After a predetermined period from time T13, data read circuit 75 amplifies read data DOUT to an effective amplitude by the sense amplifier. The data read circuit 75 latches the amplified data in the data latch circuit, and outputs the latched data. Read data DOUT is thus read from the selected cell.

Hereinafter, data write operation to a retrieval cell will be described.

At time T14 (corresponding to a rising edge of dock signal CLK), a write control signal WTE is set to "H" level in response to a chip select signal CL and a write command WT. Accordingly, the same operation as that described above for time T10 and time T11 is conducted. More specifically, decode operation is conducted based on the latched address information, and a row and a column are selected based on the decode result. At time T15, a data write current for writing write data DIN is applied to a retrieval write digit line RWDL and a retrieval bit line RBL. Write data DIN is thus written to the retrieval cell.

Hereinafter, data retrieve operation will be described.

At time T16 (corresponding to a rising edge of clock signal CLK), a retrieval control signal CP is set to "H" level in response to a chip select signal CS, a read command RD and a write command WT. Retrieval control signal CP is generated by control circuit 5.

At time T16, a row address and a column address are latched in address latch circuits 14*a*, 15*a*, 14*b*, 15*b*, 16 in response to retrieval control signal CP and clock signal CP.

Moreover, a row and a column are selected based on the latched address information. More specifically, row decoders 60 to 63 and column decoder 45 in FIG. 2 conduct decode operation.

The not-shown precharge circuit complete precharge operation, the operation of precharging each bit line BL to a predetermined voltage before data retrieve operation.

At time T17 (corresponding to the following rising edge of clock signal CLK), a word line WL for storage data and a retrieval word line RWL for retrieval data are activated according to the row address latched at time T16. Accordingly, a data retrieval current (corresponding to a data read current) is applied to each bit line BL in the selected row corresponding to the activated word line WL and each bit line BLR in the retrieval row corresponding to the activated retrieval word line RWL. As a result, a voltage (current) corresponding to storage data Rmax or Rmin of the selected memory cell is generated on each of the selected bit lines BL, BLR, and transmitted to each current comparison unit CMU of each memory cell column.

The comparison operation described above is then conducted in current detection circuit 50. More specifically, weight detection circuit 70 compares the total current amount Idt flowing through sense lines S0, S1 with reference current Iref, and outputs the comparison result CMP. For example, if the total current amount Idt flowing through sense lines S0, S1 is greater than reference current Iref, it can be determined that the storage data in the selected row and the retrieval data have a high matching ratio. In this case, the comparison result CMP is set to "H" level (not shown). Data retrieve operation of the retrieval cell is thus conducted.

As described below, in the present embodiment, data read operation of a plurality of bits is divided into a plurality of stages corresponding to the cycles of clock signal CLK, and conducted by pipeline processing.

Hereinafter, data read operation in the MRAM device of the first embodiment will be described with reference to FIG. 12.

As described above, a clock signal CLK is repeatedly activated ("H" level) and inactivated ("L" level) on a predetermined cycle. The rising edges of dock signal CLK correspond to time T1 to T6 . . . , and the corresponding cycles of clock signal CLK are referred to as cycles 160 to 164 . . . . At time T1, T2, T3, T4 (each corresponding to a rising edge of clock signal CLK), a read control signal RAD is set to "H" level in response to a chip select signal CS and a read command RD.

At time T1, a row address RA0 and a column address CA0 are latched in address latch circuits 14a, 15a, 14b, 15b and 16 in response to read control signal RAD and clock signal CLK.

In cycle 160, row decoders 60 to 63 and column decoder 45 conduct decode operation as described above.

The not-shown precharge circuit completes precharge operation, the operation of precharging each bit line BL to a predetermined voltage before data read operation. The selected memory block and the non-selected memory block are determined based on the address information latched at time T1.

In the following cycle 161 (time T2 to T3), the data decoded by the row decoders and the column decoder at time T1 is latched, and a word line WL corresponding to row address RA0 is activated. Moreover, a read column selection line RCSL of bit line BL0 corresponding to column address CA0 is activated. As a result, a voltage (current) corresponding to storage data Rmax or Rmin of the selected memory cell is generated on the selected bit line BL0 of selected memory block 10a.

Data read circuit 75 amplifies the read data to an effective amplitude in cycle 161. Latch data LD0 in latch circuit 145 becomes valid as soon as the read data is amplified to the effective amplitude.

In data read operation of the pipeline processing, row address RA is fixed (RA=RA0), whereas column address CA is updated in every cycle in a burst manner. FIG. 12 shows the first four burst operations. In other words, FIG. 12 exemplarily shows data read operation corresponding to column addresses CA0 to CA3.

Cycle 161 starts at time T2. At time T2, a new column address CA1 is latched in address latch circuits 16. In cycle 161, a column is selected according to column address CA1.

Valid latch data LD0 in latch circuit 145 is transferred to switch circuit 155 in response to the following rising edge of clock signal CLK (time T3). Accordingly, in the following cycle 162 (time T3 to T4), switch circuit 155 outputs read data DOUT (LD0) corresponding to column address CA0 and row address RA0.

In this way, data read operation is divided into first to third stages corresponding to cycles 160 to 162, and conducted by pipeline processing. In the first stage (cycle 160), substantial array operation is not conducted, and operation of fetching, latching and decoding address information is conducted. In the second stage (cycle 161), a selected word line is activated, and a bit line voltage (current) varies according to the storage data of the selected memory cell. Data read circuit 75 conducts amplifying operation based on the bit line voltage (current). In the third stage (cycle 162), read data corresponding to the address information fetched in the first stage is output.

In cycle 162, the operation of the first stage corresponding to column address CA2 and the operation of the second stage corresponding to column address CA1 are conducted in parallel with the operation of the third stage corresponding to column address CA0. In other words, in cycle 162, a bit line corresponding to column address CA1 is selected. At time T3 (cycle 162 is started at time T3), a new column address CA2 is latched in address latch circuits 14a, 15a. A column corresponding to column address CA2 is selected in cycle 162.

In cycle 163 and the following cycles, the same pipeline processing is conducted. In cycles 163, 164, bit lines BL2, BL3 corresponding to column addresses CA2, CA3 are selected, and read data DOUT (LD2, LD3) corresponding to column addresses CA2, CA3 fetched in cycles 161, 162 are output, respectively. The Read data DOUT are alternately latched in latch circuits 145, 146 and output in synchronization with clock signal CLK.

In this way, read data can be continuously output along the column direction (bit line) in an efficient manner. This enables improvement in data read operation speed in the selected row. As a result, storage data in a predetermined memory cell row can be read at a high speed based on the comparison result CMP of the data retrieve operation.

Moreover, data read operation is divided into a plurality of stages and conducted by pipeline processing. This enables improvement in data read operation speed by the high-frequency processing according to clock signal CLK.

Although the structure for continuously outputting read data along the column direction has been described above, read data may be continuously output along the row direction (word line). This can be implemented by fixing a column address and updating a row address in every cycle in a burst manner.

As described below, data write operation of a plurality of bits is also divided into a plurality of stages corresponding to the cycles of clock signal CLK and conducted by pipeline processing.

Hereinafter, data write operation in the MRAM device of the first embodiment will be described with reference to FIG. 13.

Figure 12:
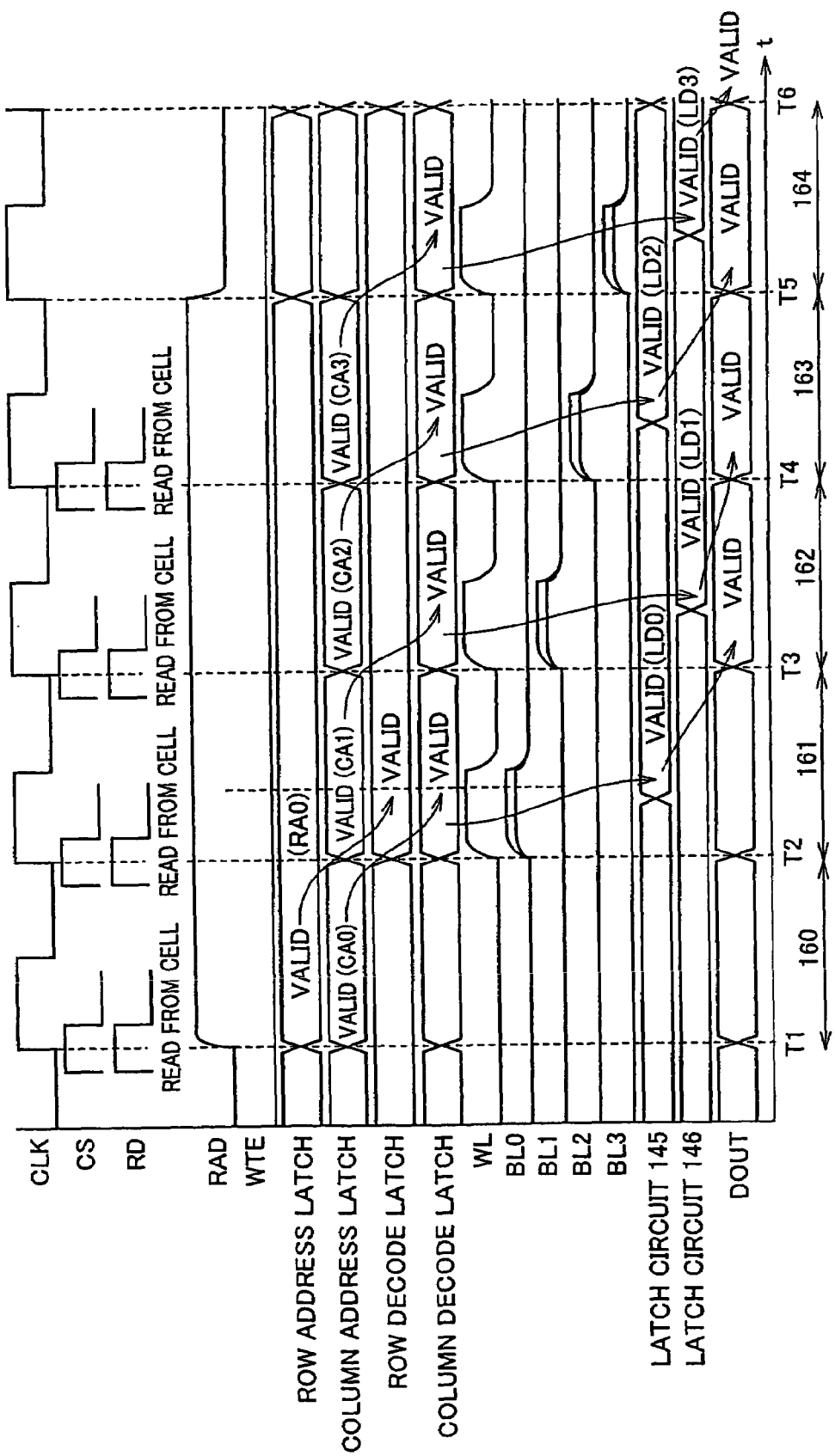
FIG. 12 is a waveform chart illustrating data read operation in the MRAM device of the first embodiment.

As in the case of FIG. 12, the rising edges of clock signal CLK correspond to times T1 to T6 . . . , and the corresponding cycles of clock signal CLK are referred to as cycles 160 to 164 . . . . At time T1, a write control signal WTE is set to "H" level in response to a chip select signal CS and a write command WT.

Figure 13:
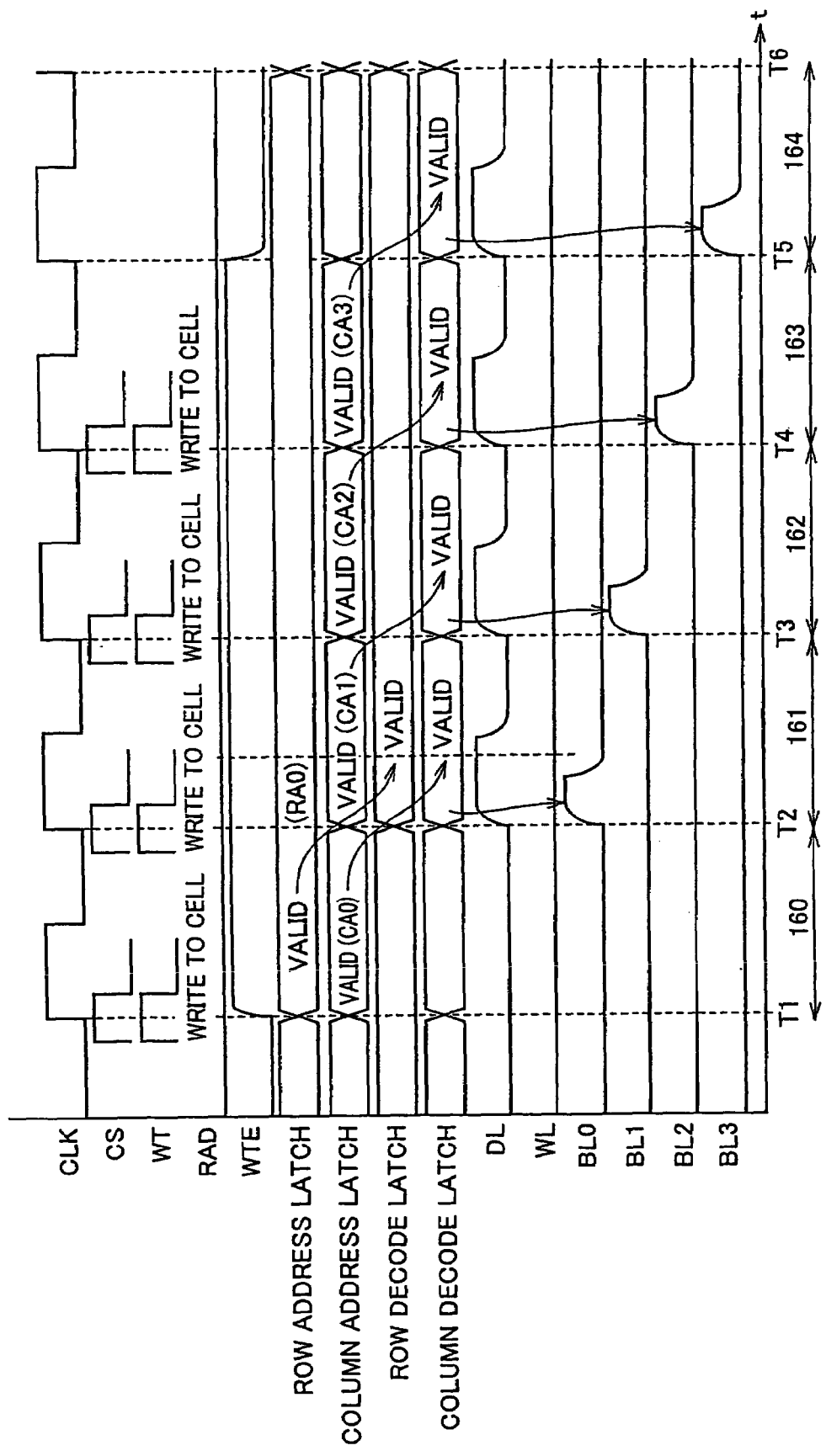
FIG. 13 is a waveform chart illustrating data write operation in the MRAM device of the first embodiment.

FIG. 13 exemplarily shows the first four data write operations.

A row address RA0 and a column address CA0 are respectively latched in address latch circuits 14a, 15a and address latch circuit 16 in response to write control signal WTE and dock signal CLK.

In cycle 160, row decoders 60 to 63 and column decoder 45 conduct decode operation. Moreover, write data DIN is transferred to the data latch circuit of FIG. 5 and latched therein for the first data write operation.

In cycle 160, write driver control circuit 76 generates data write control signals WDTa, WDTb for the first data write operation, based on the write data latched in the data latch circuit. In this way, operation in preparation for actually supplying a data write current in the following cycle 161 is conducted in step 160.

In the following cycle 161 (time T2 to T3), the data decoded in the row decoders and the column decoder at time T1 is latched, and a write digit line WDL corresponding to row address RA0 is activated. In the selected memory block 10a, data write control signals WDTa , WDTb are respectively transmitted to write drivers WDVa, WDVb of the selected bit line BL0 corresponding to column address CA0.

As a result, a data write current for writing the write data is applied to the selected write digit line (single write digit line) and the selected bit line BL0 in the selected memory block 10a. The first data write operation is thus conducted.

In data write operation as well, row address RA is fixed (RA=RA0), whereas column address CA is updated in every cycle in a burst manner. Accordingly, at time T2 (cycle 161 is started at time T2), a new column address CA1 is latched in address latch circuit 16. In cycle 161, a column corresponding to column address CA1 is selected. At time T2, the following write data DIN is transferred to the data latch circuit and latched therein.

In this way, data write operation is divided into a plurality of data write operations, and input data DIN is continuously written at least one-bit by one-bit in each of the plurality of data write operations. Data write operation is divided into first and second stages corresponding to cycles 160, 161, and conducted by pipeline processing. In the first stage (cycle 160), substantial array operation is not conducted, and operation of fetching address information and transferring input data, and operation in preparation for supplying a data write current are conducted. In the second stage (cycle 161), a data write current is actually supplied from the write driver circuits corresponding to the selected word line and the selected bit line.

In cycle 161, operation of the first stage corresponding to the following column address CA1 is conducted in parallel with the operation of the second stage corresponding to column address CA0.

In cycle 162 and the following cycles, the same pipeline processing is conducted. In cycles 162, 163, column addresses CA2, CA3 are fetched, and the write data DIN are transferred to the data latch circuit and latched therein, respectively. In cycle 162, operation in preparation for supplying a data write current corresponding to the write data is conducted. In cycle 163, operation in preparation for supplying a data write current corresponding to the following write data is conducted.

As a result, in cycles 162 to 164, selected bit lines BL1 to BL3 corresponding to column addresses CA1 to CA3 are selected, and the write data corresponding to column addresses CA1 to CA3 fetched in cycles 161 to 163 are written, respectively.

In this way, write data can be continuously written along the column direction (bit line) in an efficient manner. This enables improvement in data write operation speed in the selected row. By this data write operation, storage data used in data retrieve operation can be stored in each memory cell row at a high speed.

Moreover, data write operation is divided into a plurality of stages and conducted by pipeline processing. This enables improvement in data write operation speed by the high-frequency processing according to clock signal CLK.

Although the structure for continuously writing write data along the column direction has been described above, write data may be continuously written along the row direction (word line). This can be implemented by fixing a column address and updating a row address in every cycle in a burst manner.

Modification of First Embodiment

The structure of another MRAM device will be described in the modification of the first embodiment.

Figure 14:
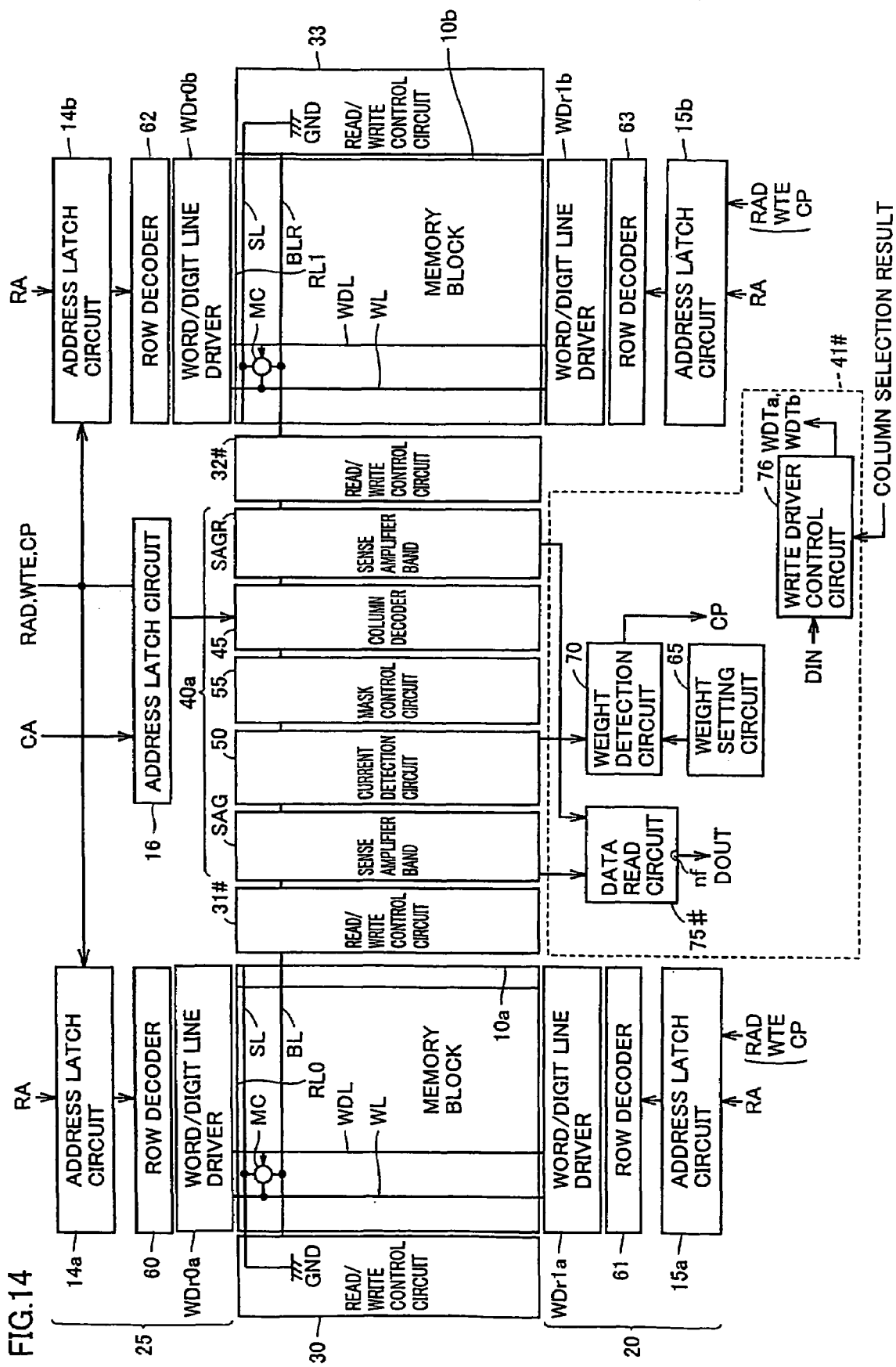
FIG. 14 is a conceptual diagram of peripheral circuitry of memory blocks according to a modification of the first embodiment of the present invention.

Referring to FIG. 14, peripheral circuitry of memory blocks 10a, 10b according to the modification of the first embodiment is different from the peripheral circuitry of memory blocks 10a, 10b in FIG. 2 in that column selection circuit 40 is replaced with a column selection circuit 40a, read/write control circuits 31, 32 are replaced with read/write control circuits 31#, 32#, and data control circuit 41 is replaced with a data control circuit 41#. Since the structure of the peripheral circuitry in the modification of the first embodiment is otherwise the same as that of the peripheral circuitry of the first embodiment in FIG. 2, description thereof will not be repeated.

Column selection circuit 40a is different from column selection circuit 40 in that column selection circuit 40a further includes a sense amplifier band SAG for amplifying data from memory block 10a, and a sense amplifier band SAGR for amplifying data from memory block 10b. Since the structure of column selection circuit 40a is otherwise the same as that of column selection circuit 40, detailed description thereof will not be repeated.

Data control circuit 41# is different from data control circuit 41 in that data read circuit 75 is replaced with a data read circuit 75#. More specifically, data read circuit 75 has a not-shown internal sense amplifier for amplifying data, whereas data read circuit 75# receives amplified data from external sense amplifier band SAG or SAGR. Since the structure of data control circuit 41# is otherwise the same as that of data control circuit 41, detailed description thereof will not be repeated.

Figure 15:
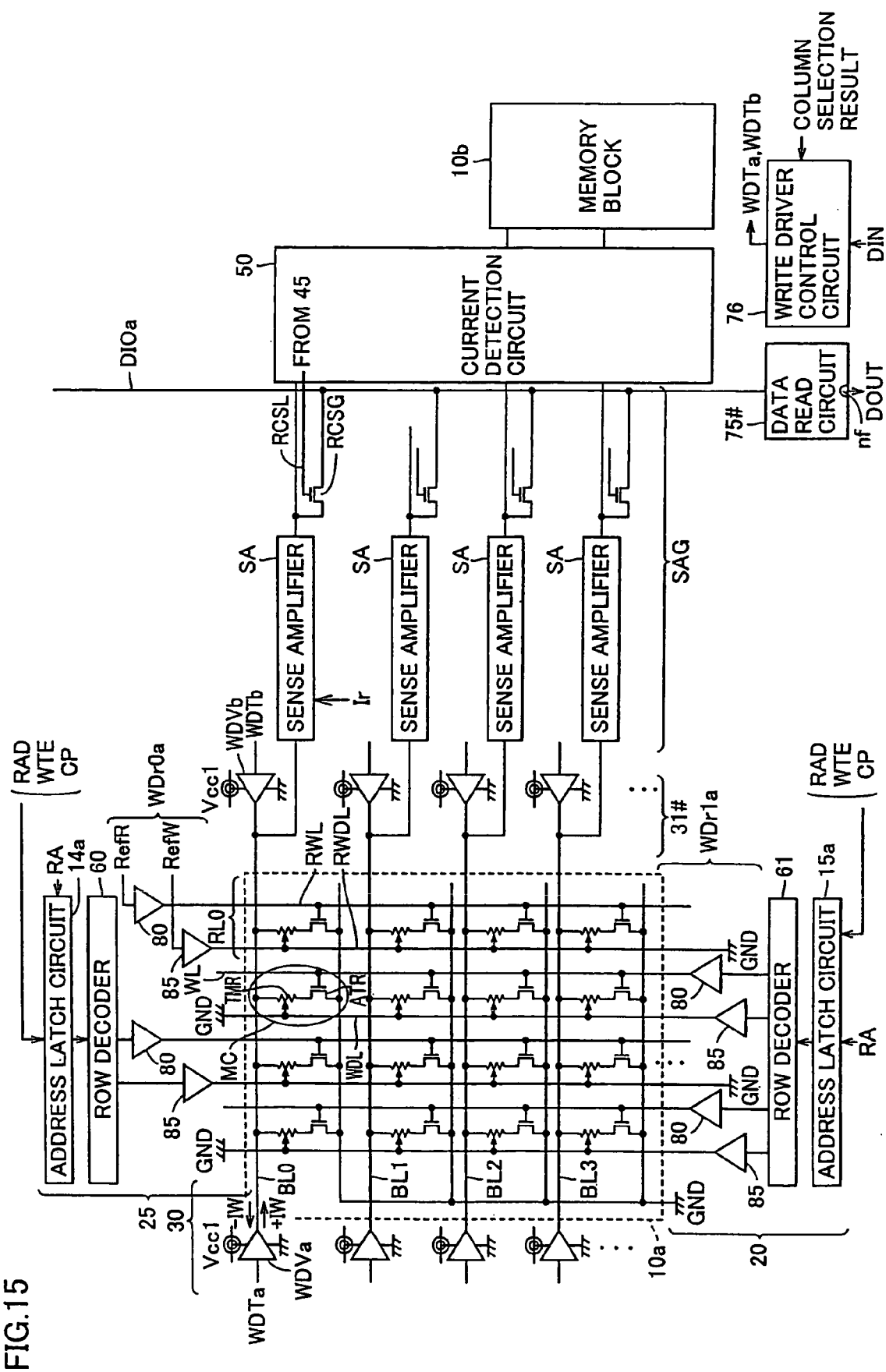
FIG. 15 specifically illustrates the structure of a memory block and its peripheral circuitry according to the modification of the first embodiment.

FIG. 15 is a circuit diagram specifically illustrating memory block 10a and its peripheral circuitry according to the modification of the first embodiment.

Referring to FIG. 15, the circuit structure according to the modification of the first embodiment is different from that of FIG. 3 in that read/write control circuit 31 is replaced with a read/write control circuit 31#, and sense amplifier band SAG is provided between read/write control circuit 31# and current detection circuit 50. Since the circuit structure in FIG. 15 is otherwise the same as that in FIG. 4, detailed description thereof will not be repeated.

Read/write control circuit 31# is different from read/write control circuit 31 in that column selection gates RCSG provided in each column and data line DIOa are eliminated. Since the structure of read/write control circuit 31# is otherwise the same as that of read/write control circuit 31, detailed description thereof will not be repeated.

Sense amplifier band SAG includes a plurality of sense amplifiers SA, a plurality of column selection gates RCSG, and a data line DIOa. The plurality of sense amplifiers SA are provided corresponding to a plurality of bit lines BL. Column selection gate RCSG is provided in each column. Each column selection gate RCSG electrically couples a corresponding bit line BL to data line DIOa. Data line DIOa is electrically coupled to column selection gates RCSG.

Each sense amplifier SA amplifies the difference between a current passing though a corresponding bit line BL and a predetermined reference current (Ir) and outputs a data signal (voltage signal) of "H" level or "L" level. It is herein assumed that, in data read operation, a data read current I0, I1 (I0>I1) flows through bit line BL according to storage data of a memory cell. Reference current Ir is set to an intermediate value of data read currents I0, I1. Sense amplifier SA thus amplifies the difference between a current passing through a corresponding bit line BL and reference current Ir and outputs a data signal of "H" level or "L" level.

With the above structure, a signal amplified by sense amplifier SA in each column is applied to current detection circuit 50. More specifically, a signal amplified by each sense amplifier SA is applied to transistors 104, 106, 112, 114 of current comparison unit CMU of FIG. 7 provided in each column.

According to the MRAM device of the modification of the first embodiment, a data retrieval current (corresponding to a data read current) passing through a bit line BL according to storage data in data retrieve operation is amplified by sense amplifier SA, and then applied to current detection circuit 50.

As a result, a greater operation margin can be ensured for the comparison operation in current comparison units CMU of current detection circuit 50, as compared to the first embodiment. In other words, data retrieve operation can be conducted with improved accuracy.

Second Embodiment

In the first embodiment, data retrieve operation is conducted using MTJ memory cells. In the second embodiment, the MTJ memory cells are used as backup storage elements in data retrieve operation.

Figure 16:
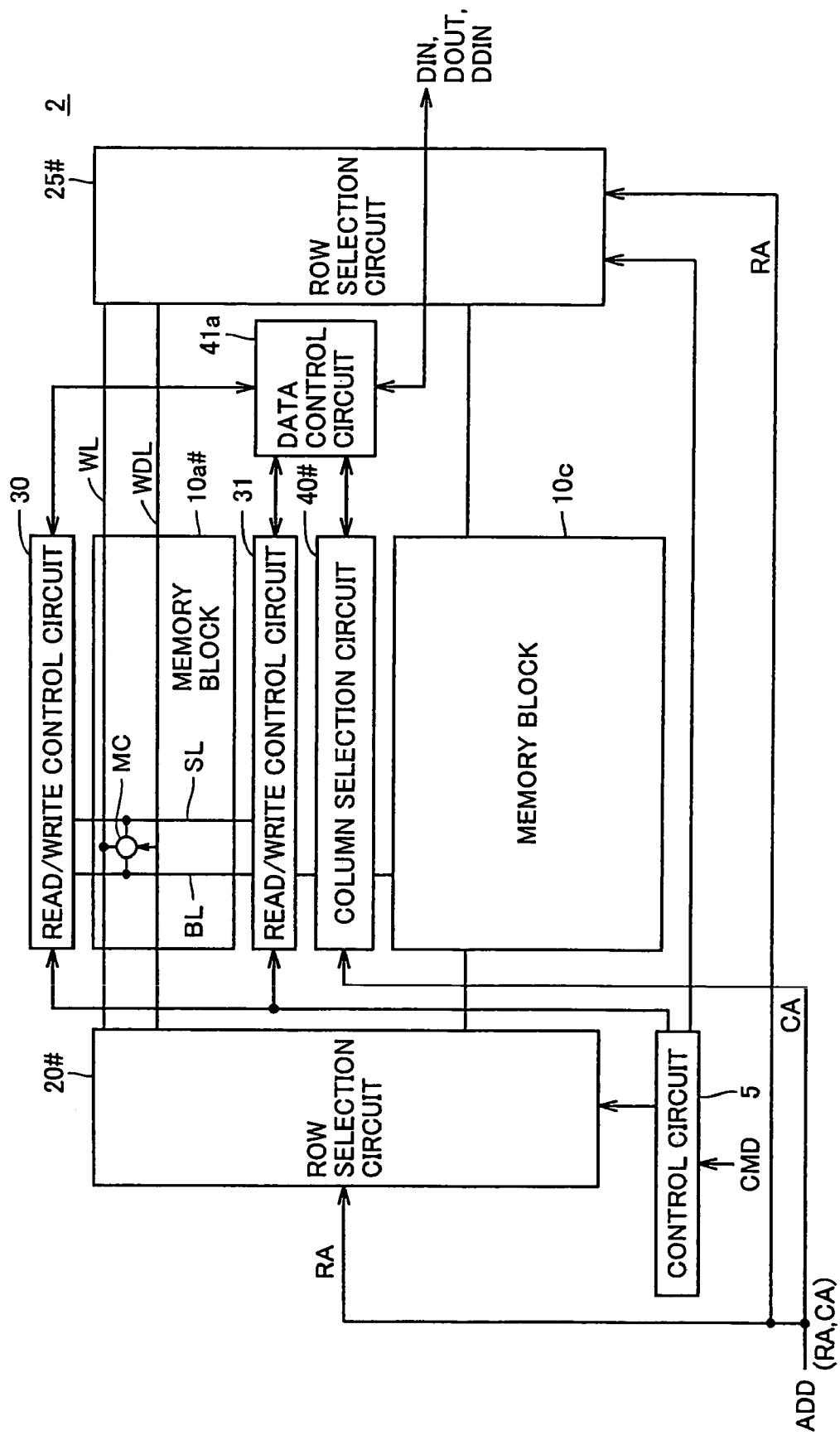
FIG. 16 shows the overall structure of an MRAM device according to a second embodiment of the present invention.

Referring to FIG. 16, an MRAM device 2 of the second embodiment is different from MRAM device 1 of FIG. 1 in the following points: memory block 10*b* is replaced with a memory block 10*c*; read/write control circuits 32, 33 provided for memory block 10*b* are eliminated; memory block 10*a* is replaced with a memory block 10*a*#; row selection circuits 20, 25 are replaced with row selection circuits 20#, 25#; column selection circuit 40 is replaced with a column selection circuit 40#; and data control circuit 41 is replaced with a data control circuit 41*a*. Since the structure of MRAM device 2 is otherwise the same as that of MRAM device 1, description thereof will not be repeated.

Figure 17:
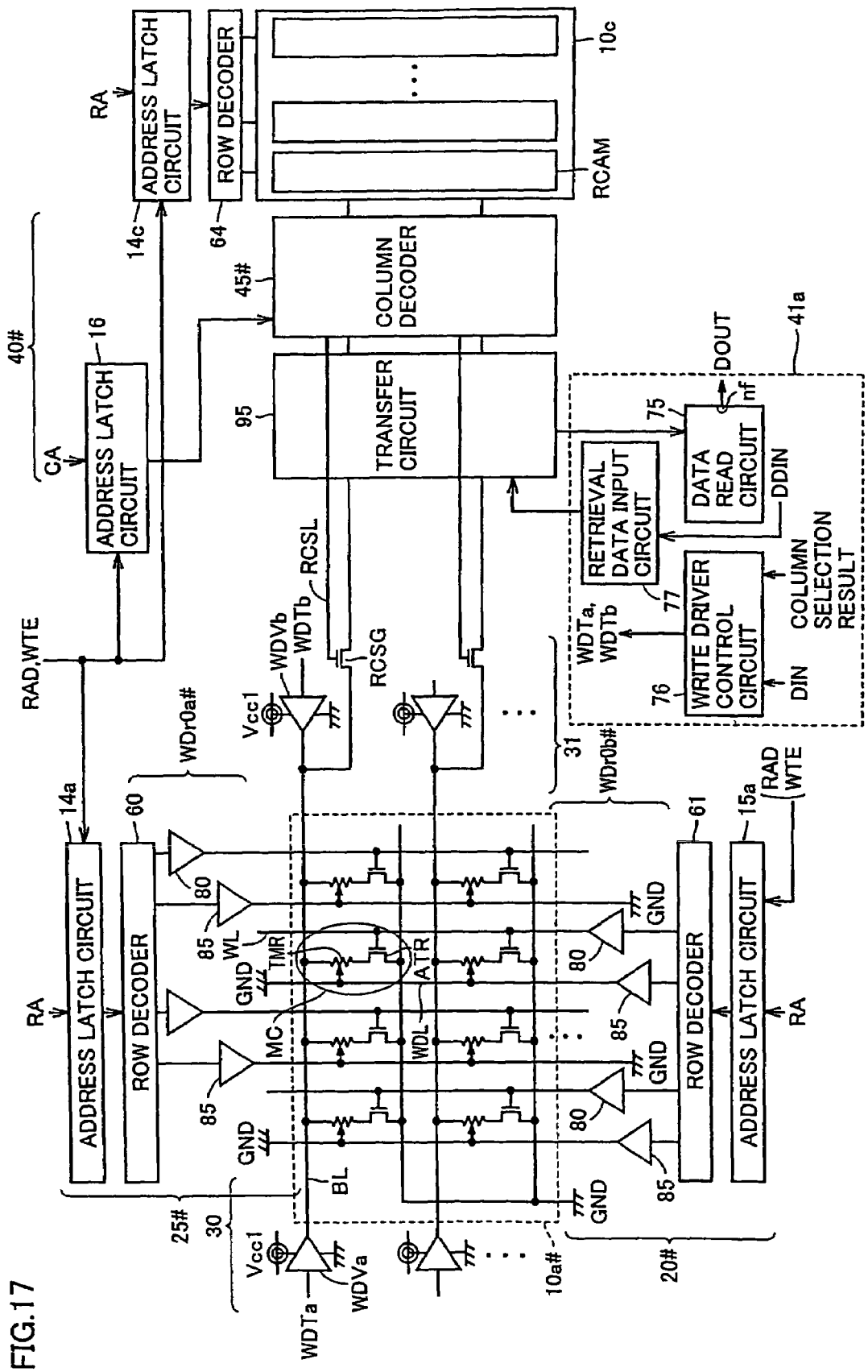
FIG. 17 shows the circuit structure of peripheral circuitry of memory blocks according to the second embodiment of the present invention.

Referring to FIG. 17, memory block 10*a*# of the second embodiment has MTJ memory cells arranged in a matrix. Memory block 10*a*# is different from memory block 10*a* in that the retrieval row used to write the retrieval data is eliminated. Since the structure of memory block 10*a*# is otherwise the same as that of memory block 10*a*, description thereof will not be repeated.

Memory block 10*c* has a plurality of memory cell rows RCAM each formed by memory cells MC# having a data retrieval function.

Row selection circuits 20#, 25# are different from row selection circuits 20, 25 in that row decoders 62, 63, word/digit line drivers WDr0*b*, WDr1*b* and address latch circuits 14*b*, 15*b*, which are provided for memory block 10*b*, are eliminated. Row selection circuit 25# is different from row selection circuit 25 in that word/digit line driver WDr0*a* is replaced with a word/digit line driver WDr0*a*#, and a row decoder 64 and an address latch circuit 14*c* are provided for memory block 10*c*. Row selection circuit 20# is different from row selection circuit 20 in that word/digit line driver WDr0*b* is replaced with a word/digit line driver WDr0*b*#. Since the structure of row selection circuits 20#, 25# are otherwise the same as that of row selection circuits 20, 25, detailed description thereof will not be repeated.

Word/digit line drivers WDr0*a*, WDr0*b* are respectively replaced with word/digit line drivers WDr0*a*#, WDr0*b*# because the retrieval row in the memory block is eliminated and thus the drivers used to drive a word line and a write digit line of the retrieval row are eliminated.

Since address latch circuit 14*c* has the same structure as that of address latch circuit 14*a* in FIG. 4, detailed description thereof will not be repeated. Row decoder 64 selects a row in memory block 10*c* based on address information latched in address latch circuit 14*a*.

Column selection circuit 40# is different from column selection circuit 40 in the following points: column decoder 45 is replaced with a column decoder 45#; a transfer circuit 95 is provided; and current detection circuit 50 and mask control circuit 55 are eliminated. Since the structure of column selection circuit 40# is otherwise the same as that of column selection circuit 40, detailed description thereof will not be repeated.

Column decoder 45# is shared by memory blocks 10*a*#, 10*c*. Column decoder 45# selects a column in memory blocks 10*a*#, 10*c*.

Transfer circuit 95 transfers read data from memory block 10*a*# to memory block 10*c*. In data retrieve operation, transfer circuit 95 applies retrieval data DDIN to memory block 10*c*. In data read operation, transfer circuit 95 transmits read data to data read circuit 75.

Data control circuit 41*a* is different form data control circuit 41 in that weight detection circuit 70 and weight setting circuit 65 are eliminated and a retrieval data input circuit 77 is provided. Since the structure of data control circuit 41*a* is otherwise the same as that of data control circuit 41, detailed description thereof will not be repeated.

In data retrieve operation, retrieval data input circuit 77 receives retrieval data DDIN from the outside, and outputs the retrieval data DDIN to transfer circuit 95.

Memory block 10*c* has memory cells MC# arranged in a matrix (not shown). In memory block 10*c*, word lines WL, retrieval selection lines MEQ and match lines ML, which are provided corresponding to the memory cell rows, and complementary bit line pairs BL,/BL are provided corresponding to the memory cell columns. Accordingly, memory cells MC# in each memory cell row RCAM share a word line WL, a retrieval selection line MEQ and a match line ML.

As described below, each memory cell MC# has a function to compare the data stored therein with retrieval data in order to determine whether or not the stored data matches the retrieval data.

Figure 18:
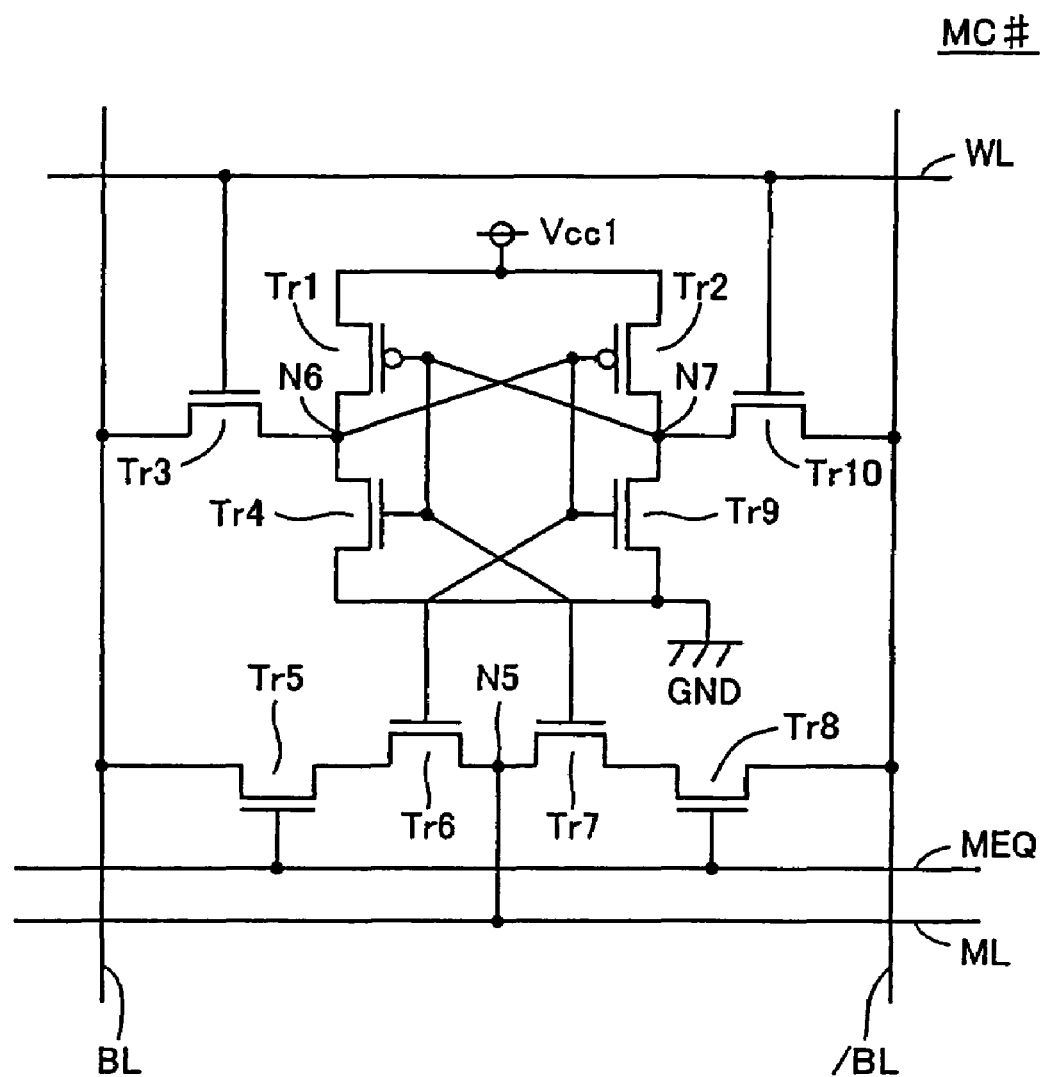
FIG. 18 shows the structure of a memory cell in a memory cell row.

Referring to FIG. 18, memory cell MC# includes transistors Tr1 to Tr10. Transistor Tr1 is provided between power supply voltage Vcc1 and a node N6, and has its gate electrically coupled to a node N7. Transistor Tr2 is provided between power supply voltage Vcc1 and node N7, and has its gate electrically coupled to a node N6. Transistor Tr3 is provided between bit line BL and node N6, and has its gate electrically coupled to word line WL. Transistor Tr4 is provided between node N6 and ground voltage GND, and has its gate electrically coupled to node N7. Transistors Tr5, Tr6 are connected in series between bit line BL and a node N5, and have their gates electrically coupled to retrieval selection line MEQ and node N6, respectively. Transistors Tr7, Tr8 are connected in series between a node N5 and bit line/BL, and have their gates electrically coupled to node N7 and retrieval selection line MEQ, respectively. Although the structure of a single memory cell MC# is described above, the other memory cells MC# have the same structure. In the specification, the symbol "/" means "inverted", "negative", "complementary" or the like. Although transistors Tr1, Tr2 are P-channel MOS transistors and transistors Tr3 to Tr10 are N-channel MOS transistors in this example, the present invention is not limited to this.

Hereinafter, basic operation of memory cell MC# will be described.

In normal operation, retrieval selection line MEQ is set to "L" level. Normal data write operation and normal data read operation to and from a so-called SRAM cell can thus be conducted.

Since the data write operation and data read operation to and from an SRAM cell are commonly known in the art, detailed description thereof will not be repeated.

In data retrieve operation, all word lines WL are set to "L" level. Moreover, retrieval selection lines MEQ and match lines ML are set to "H" level, and data is applied to a bit line pair BL,/BL designated for data retrieve operation. The other bit line pairs BL,/BL are retained at "H" level.

Operation of memory cell MC# in data retrieve operation will be described. It is herein assumed that storage data is "1". In this case, node N6 is at "H" level and node N7 is at "L" level. Moreover, "H" level and "L" level are respectively applied to a bit line pair BL,/BL according to retrieval data "1".

Since retrieval selection line MEQ is at "H" level, transistors Tr5, Tr8 are turned ON. Moreover, since node N6 is at "H" level, transistor Tr6 is also turned ON. Accordingly, bit line BL is electrically coupled to node N6 through transistors Tr5, Tr6. Since the voltage level on bit line BL is at "H" level and node N6 is at "H" level, the bit of the retrieval data matches the bit of the storage data. Therefore, match line ML is retained at "H" level.

It is now assumed that "L" level and "H" level are respectively applied to a bit line BL,/BL according to retrieval data "0".

In this case, bit line BL is at "L" level. Therefore, when bit line BL is electrically coupled to node N6, match line ML is pulled down from "H" level to "L" level. Accordingly, in the case where the bit of the retrieval data does not match the bit of the storage data, match line MC is set to "L" level.

In this way, whether or not the storage data matches the retrieval data can be determined by comparison operation conducted by memory cell MC#.

Hereinafter, data retrieve operation in MRAM device 2 of the second embodiment will be described.

Storage data used for data retrieve operation is pre-stored in memory block 10a#. Note that write operation and read operation of the storage data stored in memory block 10a# are conducted in the same manner as that described in the first embodiment. Therefore, description thereof will not be repeated.

According to an instruction from control circuit 5 in response to an external command CMD, transfer circuit 95 transfers the storage data pre-stored in memory block 10a# before data retrieve operation to memory cell rows RCAM of memory block 10c on a row-by-row basis.

For example, transfer circuit 95 can transfer the storage data to memory block 10c by reading and latching data from each memory cell row of memory block 10a# on a bit-by-bit basis, and writing each bit to a corresponding bit (a corresponding column) of each memory cell row RCAM in memory block 10c.

Transfer circuit 95 thus transfers the storage data in memory block 10a# to memory block 10c.

In data retrieve operation, retrieval data input circuit 77 receives retrieval data DDIN from the outside, and outputs the retrieval data DDIN to transfer circuit 95.

In data retrieve operation, transfer circuit 95 transfers the retrieval data DDIN received from retrieval data input circuit 77 to memory block 10c. More specifically, transfer circuit 95 applies data corresponding to each bit of the retrieval data to bit lines BL,/BL of each column in memory block 10c.

The comparison operation described above is conducted in each memory cell row RCAM in memory block 10c.

In each memory cell row RCAM, match line ML is retained at "H" level only when all bits of the retrieval data match the storage data. If at least one of the bits of the retrieved data does not match the storage data, match line ML is set to "L" level.

Therefore, the matching ratio between the applied retrieval data DDIN and the storage data transferred to memory block 10c can be determined by determining the voltage level of each match line ML of each memory cell row.

According to the MRAM device of the second embodiment, storage data is stored in memory block 10a# formed by non-volatile MTJ memory cells MC, and data retrieve operation is conducted using conventionally used SRAM cells.

Therefore, storage data can be held in a non-volatile manner in memory block 10a# even if supply of a power supply voltage is discontinued. This assures stable data retrieve operation.

Note that, in the example described above, data retrieve operation is conducted in memory block 10c. However, memory block 10c can also be used for an address storage section for a cache, an address comparison section of a redundant determination circuit, or the like.

In the example described above, the storage data in memory block 10a# is transferred to memory block 10c in order to conduct comparison operation. However, the storage data may either be entirely or partially transferred to memory block 10c. More specifically, the capacity of memory block 10c may be reduced, and the storage data may be transferred little by little to memory block 10c having a reduced capacity. In this case, the area of memory block 10c formed by SRAM cells having a function to conduct comparison operation can be reduced.

Third Embodiment

In the third embodiment of the present invention, the structure of an OUM cell which can be replaced with an MTJ memory cell in the non-volatile memory device of the first and second embodiments will be described.

Figure 19:
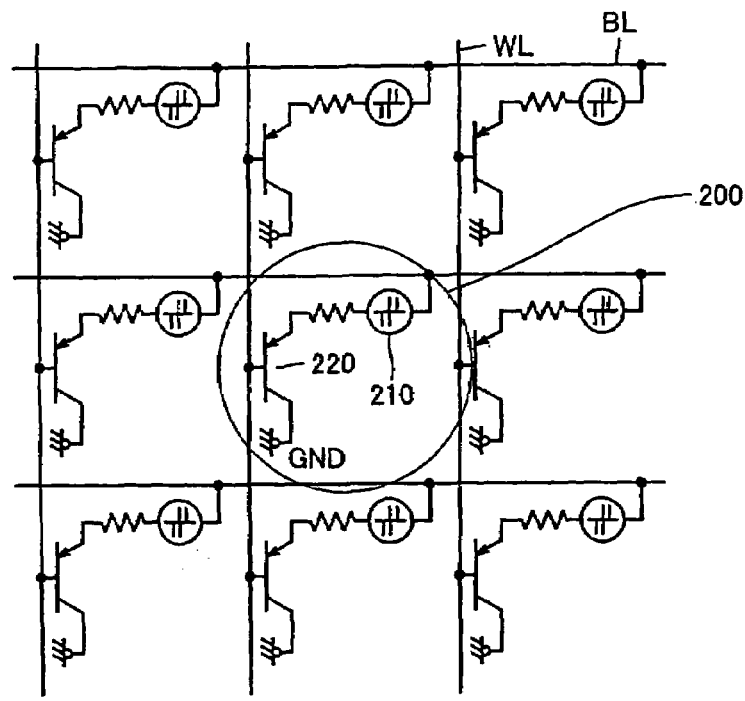
FIG. 19 is a circuit diagram showing the structure of a memory block formed by OUM cells according to a third embodiment of the present invention.

Referring to FIG. 19, a memory block 10# of the third embodiment is formed by OUM cells. Memory block 10# has OUM cells 200 arranged in a matrix. Word lines WL are provided corresponding to the OUM cell rows, and bit lines BL are provided corresponding to the OUM cell columns. Each OUM cell 200 has a chalcogenide layer 210 and a switching transistor 220 which are connected in series between a corresponding bit line BL and ground voltage GND. Chalcogenide layer 210 is a phase change element. The gate of switching transistor 220 is connected to a corresponding word line WL, the drain thereof is connected to chalcogenide layer 210, and the source thereof is connected to ground voltage GND.

Hereinafter, the structure of the OUM cell will be described.

Figure 20:
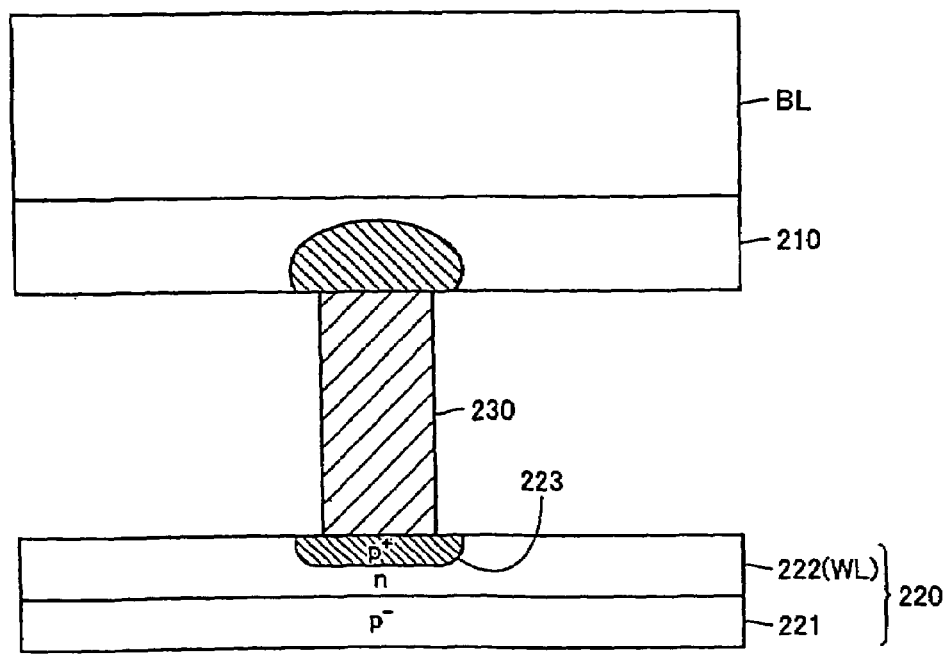
FIG. 20 is a cross-sectional view of an OUM cell.
Figure 21:
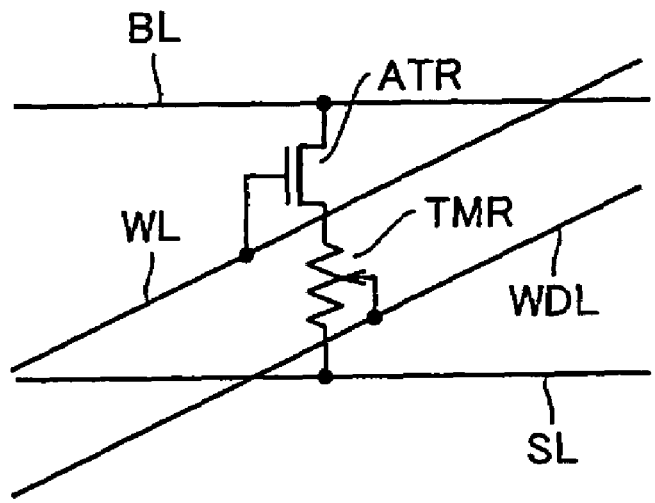
FIG. 21 schematically shows the structure of a memory cell having a magnetic tunnel junction.
Figure 22:
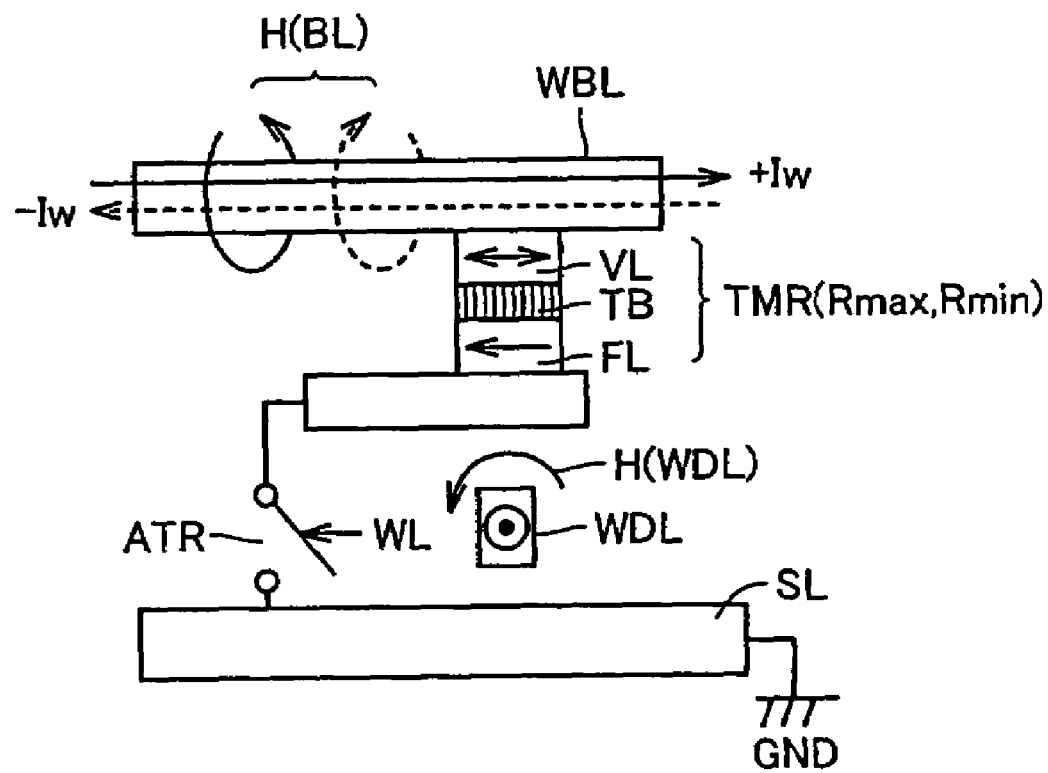
FIG. 22 is a conceptual diagram illustrating data write operation to an MTJ memory cell.
Figure 23:
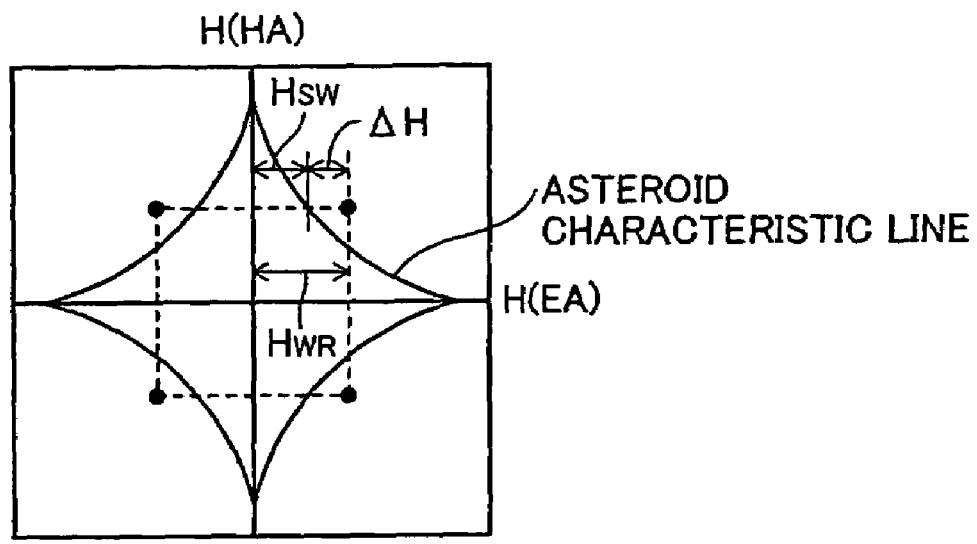
FIG. 23 is a conceptual diagram illustrating the relation between a data write current and a magnetization direction of a tunneling magneto-resistance element in data write operation.
Figure 24:
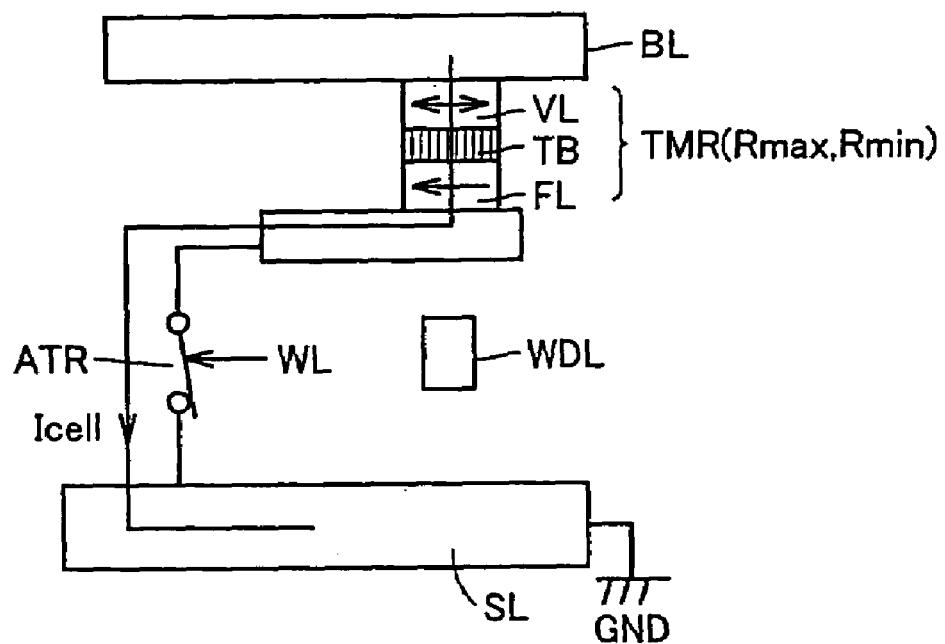
FIG. 24 is a conceptual diagram illustrating data read operation from an MTJ memory cell.
Figure 25:
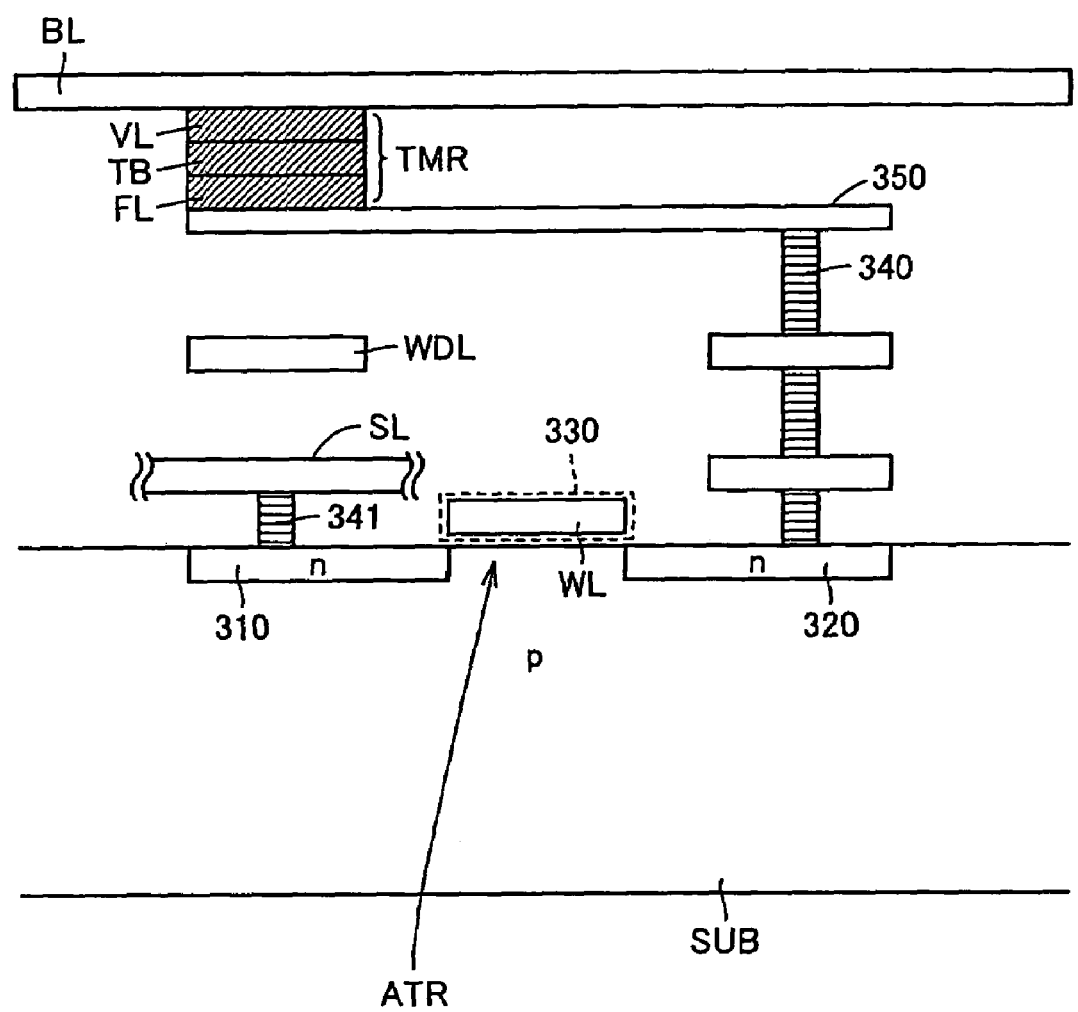
FIG. 25 shows the structure of an MTJ memory cell formed on a semiconductor substrate.

Referring to FIG. 20, switching transistor 220 has an n-type region 222 formed on a p-type region 221, and a p-type region 223 formed in n-type region 222. Switching transistor 220 is a pnp-type vertical parasitic bipolar transistor formed by p-type region 221, n-type region 222 and p-type region 223.

In switching transistor 220, n-type region 222 corresponds to word line WL in FIG. 19. A heat-generating element 230 for generating heat by a current passing therethrough is provided between chalcogenide layer 210 and switching transistor 220. In data write operation, switching transistor 220 is turned ON, and a data write current is supplied from bit line BL so as to flow through chalcogenide layer 210 and heat-generating element 230. The phase of chalcogenide layer 210 changes into either a crystalline state or an amorphous state according to the supply pattern of the data write current (e.g., current supply period and current supply amount). The electric resistance of chalcogenide layer 210 varies between the amorphous state and the crystalline state. More specifically, chalcogenide layer 210 has a higher electric resistance in the amorphous state than in the crystalline state.

Accordingly, in data read operation, switching transistor 220 is turned ON so that a data read current having such a level that does not cause phase change flows through chalcogenide layer 210. As a result, data read operation can be conducted based on the electric resistance difference in the same manner as that using the MTJ cells.

Accordingly, by changing the structure of the write drivers included in the read/write control circuits to the structure adapted to the OUM cells, data read operation, data write operation and data retrieve operation can be conducted in the same manner as that of MRAM device 1 of FIG. 1 by using the same peripheral circuit structure. In other words, data read operation, data write operation and data retrieve operation can be conducted in the same manner as that of MRAM device 1 of FIG. 1 even if MTJ memory cells MC in MRAM device 1 of FIG. 1 are replaced with the OUM cells of FIG. 19 in memory block 10#. Accordingly, the non-volatile memory device having the OUM cells provides the same effects as those of the first and second embodiments.

In the present embodiment, the structure of the MRAM device (non-volatile memory device) having two memory blocks to be selectively accessed is described. However, the present invention is not limited to this structure. The same peripheral circuit structure is applicable to an MRAM device having three or more memory blocks, and an MRAM device having a single memory block, i.e., an MRAM device that does not require selection of a memory block.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A non-volatile memory device, comprising:
   a plurality of memory cells arranged in a matrix, and each having an electric resistance varying according to storage data written in a non-volatile manner by a data write current;
   a plurality of word lines provided corresponding to memory cell rows respectively;
   a plurality of bit lines provided corresponding to memory cell columns respectively; and
   a control circuit for conducting one of data write operation and data read operation wherein
   each of data write operation and data read operation is divided into a plurality of cycles, said control circuit conducts a part of said one of data write operation and data read operation in each of said cycles by pipeline processing,
   in response to activation of a word line corresponding to a selected memory cell row, memory cells of the selected memory cell row are electrically coupled to corresponding bit lines respectively, and
   said non-volatile memory device further comprises a mask circuit for stopping, in response to an instruction, a part of passing currents flowing respectively through said corresponding bit lines that are electrically coupled to said memory cells respectively of said selected memory cell row.

* * * * *